(12) United States Patent
Bullen

(10) Patent No.: US 10,457,148 B2
(45) Date of Patent: Oct. 29, 2019

(54) SOLAR CAR

(71) Applicant: Epic Battery Inc., Fremont, CA (US)

(72) Inventor: Melvin James Bullen, Los Gatos, CA (US)

(73) Assignee: EPIC BATTERY INC., Fremont, CA (US)

(*) Notice: Subject to any disclaimer, the term of this patent is extended or adjusted under 35 U.S.C. 154(b) by 0 days.

(21) Appl. No.: 15/954,408

(22) Filed: Apr. 16, 2018

(65) Prior Publication Data

US 2018/0244160 A1 Aug. 30, 2018

Related U.S. Application Data

(63) Continuation-in-part of application No. 15/944,706, filed on Apr. 3, 2018, which is a continuation-in-part of application No. 15/902,961, filed on Feb. 22, 2018.
(Continued)

(51) Int. Cl.
H01L 31/048 (2014.01)
B60L 8/00 (2006.01)
(Continued)

(52) U.S. Cl.
CPC ............ B60L 8/003 (2013.01); B60K 16/00 (2013.01); B60L 15/20 (2013.01); B60L 50/53 (2019.02);
(Continued)

(58) Field of Classification Search
CPC ......... B60L 8/003; B60L 50/53; B60L 15/20; B60L 2210/10; B60L 2220/50;
(Continued)

(56) References Cited

U.S. PATENT DOCUMENTS 389,124 A 9/1888 Weston
1,862,559 A 6/1932 White
(Continued)

FOREIGN PATENT DOCUMENTS

CN 103481772 A 1/2014
EP 2523246 A1 11/2012
(Continued)

OTHER PUBLICATIONS (A) Wikipedia, "Artificial Sunlight," retrieved from the Internet on Sep. 27, 2016; 3 pages.
(Continued)

Primary Examiner — Golam Mowla
(74) Attorney, Agent, or Firm — Schwabe Williamson & Wyatt, PC

(57) ABSTRACT

Described herein are apparatuses, systems, and methods for a solar car. The exterior of the solar car is comprised of smoothly curved and continuous photovoltaic cells. The exterior car parts, e.g., roof, doors, hood, trunk and so forth, may include integrated photovoltaic cells, all manufactured in the shape of the corresponding car parts. The photovoltaic cells are meta-encapsulated in an edgeless manner, and may utilize superconducting anodes. A first encapsulate may be polychlorotrifluoroethylene, an extreme water barrier. A second encapsulate, e.g., silicone, may be a water barrier and shock absorber. A third encapsulate may be UV stabilized polycarbonate or low iron glass. A street legal solar car may be constructed upon an electric car chassis. A competition solar car has one or more hyper-efficient electric motors, that may utilize superconducting wire in their armatures. Superconducting wire may also be used in the vehicle chassis.

29 Claims, 15 Drawing Sheets

Related U.S. Application Data

(60) Provisional application No. 62/485,399, filed on Apr. 14, 2017, provisional application No. 62/485,396, filed on Apr. 14, 2017, provisional application No. 62/481,075, filed on Apr. 3, 2017, provisional application No. 62/462,924, filed on Feb. 24, 2017.

(51) Int. Cl.
| | |
|---|---|
| *H02S 40/38* | (2014.01) |
| *H01L 31/0468* | (2014.01) |
| *H01L 31/18* | (2006.01) |
| *H01L 31/0352* | (2006.01) |
| *H01L 31/0224* | (2006.01) |
| *H02K 1/02* | (2006.01) |
| *H02K 1/14* | (2006.01) |
| *H02K 1/27* | (2006.01) |
| *H02K 3/52* | (2006.01) |
| *H02K 7/09* | (2006.01) |
| *H02K 11/33* | (2016.01) |
| *H02K 11/00* | (2016.01) |
| *H02J 7/35* | (2006.01) |
| *G05F 1/67* | (2006.01) |
| *B60L 15/20* | (2006.01) |
| *B60K 16/00* | (2006.01) |
| *H02S 10/40* | (2014.01) |
| *H02K 5/06* | (2006.01) |
| *B60L 50/53* | (2019.01) |
| *H02S 20/30* | (2014.01) |

(52) U.S. Cl.
 CPC ........ *G05F 1/67* (2013.01); *H01L 31/022425* (2013.01); *H01L 31/035281* (2013.01); *H01L 31/0468* (2014.12); *H01L 31/0481* (2013.01); *H01L 31/18* (2013.01); *H02J 7/355* (2013.01); *H02K 1/02* (2013.01); *H02K 1/141* (2013.01); *H02K 1/2753* (2013.01); *H02K 3/521* (2013.01); *H02K 5/06* (2013.01); *H02K 7/09* (2013.01); *H02K 11/0094* (2013.01); *H02K 11/33* (2016.01); *H02S 10/40* (2014.12); *H02S 20/30* (2014.12); *H02S 40/38* (2014.12); *B60K 2016/003* (2013.01); *B60L 2210/10* (2013.01); *B60L 2220/50* (2013.01); *B60L 2240/421* (2013.01); *B60L 2240/423* (2013.01); *Y02E 10/58* (2013.01); *Y02T 10/7258* (2013.01)

(58) Field of Classification Search
 CPC ......... B60L 2240/421; B60L 2240/423; H02S 40/38; H02S 10/40; H02S 20/30; H01L 31/0481; H01L 31/0468; H01L 31/18; H01L 31/035281; H01L 31/022425; H02K 1/02; H02K 1/141; H02K 1/2753; H02K 3/521; H02K 7/09; H02K 11/33; H02K 11/0094; H02K 5/06; H02J 7/355; G05F 1/67; B60K 16/00; B60K 2016/003; Y02T 10/7258; Y02E 10/58
 See application file for complete search history.

(56) References Cited

U.S. PATENT DOCUMENTS

| | | |
|---|---|---|
| 2,396,419 A | 3/1946 | Hassel |
| D171,628 S | 3/1954 | Weddell |
| 3,123,321 A | 3/1964 | Custer |
| 3,696,283 A | 10/1972 | Ackley, III |
| 4,083,097 A | 4/1978 | Anagnostou |
| 4,170,507 A | 10/1979 | Keeling |
| 4,374,955 A | 2/1983 | Gupta |
| 4,383,129 A | 5/1983 | Gupta |
| 4,563,727 A | 1/1986 | Curiel |
| 4,592,436 A | 6/1986 | Tomei |
| 4,692,557 A | 9/1987 | Samuelson |
| 4,832,755 A | 5/1989 | Barton |
| 4,857,095 A | 8/1989 | Brown |
| 5,138,699 A | 8/1992 | Minor |
| 5,202,211 A | 4/1993 | Vercoulen |
| 5,238,674 A | 8/1993 | Vercoulen |
| 5,273,608 A | 12/1993 | Nath |
| 5,582,653 A | 12/1996 | Kataoka |
| 5,608,385 A | 3/1997 | Masaki |
| 5,668,424 A | 9/1997 | Lamb |
| 5,707,459 A | 1/1998 | Itoyama |
| 5,848,904 A | 12/1998 | Kikuchi |
| 6,005,317 A | 12/1999 | Lamb |
| 6,042,806 A | 3/2000 | Bedard |
| 6,078,165 A | 6/2000 | Ashtiani |
| 6,204,139 B1 | 3/2001 | Liu |
| 6,268,059 B1 | 7/2001 | Cronin |
| 6,366,739 B1 | 4/2002 | Yoshihara |
| 6,551,741 B1 | 4/2003 | Hamada |
| 6,660,930 B1 | 12/2003 | Gonsiorawski |
| 6,668,444 B2 | 12/2003 | Ngo |
| 6,685,882 B2 | 2/2004 | Deevi |
| 6,745,977 B1 | 6/2004 | Long |
| D630,162 S | 1/2011 | Bullen |
| 8,373,191 B2 | 2/2013 | Ide |
| 8,421,400 B1 | 4/2013 | Khanna |
| 8,487,778 B2 | 7/2013 | Kang |
| 8,505,351 B2 | 8/2013 | Klatt |
| 8,531,152 B2 | 9/2013 | Blau |
| 8,629,646 B2 | 1/2014 | Bullen |
| 8,701,800 B2 | 4/2014 | Hui |
| 8,753,918 B2 | 6/2014 | Varghese |
| 8,851,560 B1 | 10/2014 | Freeman |
| 8,946,113 B2 | 2/2015 | Moon |
| 9,054,249 B2 | 6/2015 | Chaudhari |
| 9,543,537 B2 | 1/2017 | Steirer |
| 9,608,159 B2 | 3/2017 | Chaudhari |
| 10,340,458 B2 | 7/2019 | Gong |
| 2002/0086446 A1 | 7/2002 | Charpentier |
| 2005/0133085 A1 | 6/2005 | Shimada |
| 2005/0243345 A1 | 11/2005 | Foehr |
| 2006/0253356 A1 | 11/2006 | Charles |
| 2007/0007240 A1 | 1/2007 | Wise |
| 2007/0087266 A1 | 4/2007 | Bourke |
| 2007/0273327 A1 | 11/2007 | Daniel |
| 2008/0235156 A1 | 9/2008 | Amodeo |
| 2009/0053511 A1 | 2/2009 | Kim |
| 2009/0288890 A1 | 11/2009 | Freeman |
| 2009/0309893 A1 | 12/2009 | Boothroyd |
| 2010/0096004 A1* | 4/2010 | Hu .............. B82Y 20/00 136/256 |
| 2010/0173188 A1 | 7/2010 | Dhawan |
| 2010/0193260 A1 | 8/2010 | Freeman |
| 2010/0198754 A1 | 8/2010 | Jones |
| 2010/0235219 A1 | 9/2010 | Merrick |
| 2010/0320958 A1 | 12/2010 | Kawitt |
| 2011/0129676 A1* | 6/2011 | Bravet .............. B32B 27/08 428/413 |
| 2011/0146794 A1 | 6/2011 | Tsai |
| 2011/0200867 A1 | 8/2011 | Culver |
| 2011/0297459 A1* | 12/2011 | Hayek ............. B60K 16/00 180/2.2 |
| 2012/0028098 A1 | 2/2012 | Meehan |
| 2012/0060910 A1 | 3/2012 | Schoenfeld |
| 2012/0070934 A1 | 3/2012 | Mitra |
| 2012/0080753 A1 | 4/2012 | Singh |
| 2012/0183832 A1 | 7/2012 | Culver |
| 2012/0186623 A1 | 7/2012 | Bulovic |
| 2012/0229067 A1 | 9/2012 | Barbero |
| 2013/0043826 A1 | 2/2013 | Workman |
| 2013/0099765 A1 | 4/2013 | Girard |
| 2013/0126666 A1 | 5/2013 | Brown |
| 2013/0236764 A1 | 9/2013 | Hu |
| 2014/0093734 A1 | 4/2014 | Mogi |
| 2014/0130864 A1 | 5/2014 | Lunt |
| 2014/0252342 A1 | 9/2014 | Ramadas et al. |
| 2014/0283896 A1 | 9/2014 | Lunt, III |

(56) References Cited

U.S. PATENT DOCUMENTS

| | | | |
|---|---|---|---|
| 2015/0053258 | A1 | 2/2015 | Beck |
| 2015/0060743 | A1 | 3/2015 | Yashima |
| 2015/0144196 | A1 | 5/2015 | Irwin |
| 2015/0199062 | A1 | 7/2015 | Lang |
| 2015/0256026 | A1 | 9/2015 | Rybkiewicz |
| 2015/0311504 | A1 | 10/2015 | Hong et al. |
| 2015/0345006 | A1 | 12/2015 | Uprety |
| 2016/0133672 | A1 | 5/2016 | Koposov |
| 2016/0163904 | A1 | 6/2016 | Mailoa |
| 2016/0289867 | A1 | 10/2016 | Ozcan |
| 2016/0322172 | A1 | 11/2016 | Chaudhari |
| 2016/0322509 | A1 | 11/2016 | Singh |
| 2016/0339160 | A1 | 11/2016 | Bedworth et al. |
| 2016/0351841 | A1 | 12/2016 | Suzuka |
| 2017/0018372 | A1 | 1/2017 | Fujimura |
| 2017/0104440 | A1* | 4/2017 | Sakabe ............ H02S 10/40 |
| 2018/0244160 | A1 | 8/2018 | Bullen |

FOREIGN PATENT DOCUMENTS

| | | | | |
|---|---|---|---|---|
| EP | 2634146 | A1 | 9/2013 | |
| EP | 2693503 | A1 | 2/2014 | |
| WO | 1998/057414 | A1 | 12/1998 | |
| WO | 2001/072652 | A1 | 10/2001 | |
| WO | 2005/060624 | A2 | 7/2005 | |
| WO | 2013/119113 | A1 | 8/2013 | |
| WO | WO-2013119113 | A1 * | 8/2013 | ......... H01L 31/0481 |
| WO | 2014/045021 | A1 | 3/2014 | |
| WO | 2014/097299 | A1 | 6/2014 | |
| WO | 2015/031944 | A1 | 3/2015 | |
| WO | 2016/152704 | A1 | 9/2016 | |
| WO | 2018/156987 | A1 | 8/2018 | |
| WO | 2018/187384 | A1 | 10/2018 | |
| WO | 2018/191756 | A2 | 10/2018 | |

OTHER PUBLICATIONS (B) Meek, et al. "Clothoid Spline Transition Spirals" Mathematics of Computation, vol. 59, No. 199; Jul. 1992; pp. 117-133.
(C) Liu et al., "Figure 1: Device architecture and energy-level diagram" Nature Photonics 8, (2014); 3 pages.
(D) Dyesol Materials Catalogue (2016); 44 pages; retrieved from the Internet from <http://3d-nano.com/wp-content/ uploads/2016/09/Dyesol-Material-Catalogue.pdf>.
(E) Petropoulos, et al., "Beyond Fick: How Best to Deal with non-Fickian Behavior in a Fickian Spirit" Diffusion- rundamentals. org 11 (2009) 5; 21 pages.
(F) Gehlhaar et al., Solar & Alternative Energy Perovskite solar modules with minimal area loss interconnections; Oct. 29, 2015 SPIE Newsroom. Retrieved from the Internet from<http://spie.org/newsroom/6116-perovskite-solar- modules-with-minimal-area-loss-interconnections?ArticleID=x115669>.
(G) Zhang et al., "Highly Efficient Perovskite Solar Cells with Tunable Structural Color"; Nano Letters (2015) vol. 15:1698-1702; DOI: 10.1021/nl504349z.
(H) "Perovskites and Perovskite Solar Cells: An Introduction" Ossila Ltd.; 10 pages; downloaded from the Internet on Oct. 5, 2016 from <http://localhost/Users/jamie/Solarjoos/patents/stable%20perovskite/technical%JOdocumentation/Perovskites%20and%20Perovskite%20Solar"/o20Cells_%20An%1ntroduction%20%E2%80%93%JOOssila.html>.
(I) Wikipedia, "Perovskite solar cell," retrieved from the Internet on Sep. 26, 2016; 14 pages.
(I) Wikipedia, "Polycarbonate", retrieved from the Internet Sep. 26, 2016; 10 pages.
(J) Jordan et al. "Photovoltaic Degradation Rates—An Analytical Review," National Renewable Energy Laboratory, Journal article NREUJA-5200-51664; Jun. 2012; 32 pages; available electronically at <http://www.osti.gov/bridge>.
(K) Mitsubishi Engineering-Plastics Corporation; Physicality catalog Chapter 6 "Chemical Properties"; 10 pages; Downloaded from the Internet at<https:/lwww.m-ep.eo.jp/en/pdf/product/iupi_nova/physicality_06.pdf>.

(M) E Ink Triton "Imaging Film" Technical Spec Sheet; 1 page; retrieved from the Internet on Sep. 4, 2016 from <http://www2.eink.com/sell_sheets/triton_spec_sheet.pdf>.
"Aircraft Electrical Wiring Interconnect System (EWIS) Best Practices", Federal Aviation Agency, Job Aid 2.0, 2016; 1 page.
"List of carbon fiber monocoque cars", Wikipedia, 2017.
"Magnetic coupling is 'cheaper than a VSD'", Drives and Controls Magazine, May 2001.
"Neodymium-Iron-Boron Magnet Grades", Arnold Magnetic Technologies Inc., 2017.
"PIC12 (L) F1571/2 Technical Reference", Microchip, 2016, 334 pages.
"Radio-frequency identification" from Wikipedia; downloaded from the Internet <https://en.wikipedia.org/w/index.php?title=Radio-frequency_identification&oldid=802966994>; (2017) 28 pages.
"Rural Modular Energy Solution", Leks Environmental Ltd., 2017; <retrieved from the Internet at http://leks-re.com/rural-modular-energy-solution>; 4 pages.
"Sintered Neodymium-Iron-Boron Magnets", Arnold Magnetic Technologies Inc., 2017.
"Sustainable, high energy density battery created", City College of New York, 2017.
"Vantablack" from Wikipedia; downloaded from the Internet on Jul. 14, 2017 at <https://en.wikipedia.org/wiki/Vantablack>; 4 pages.
"Waterproofing", SVSeeker, downloaded from the Internet at <http://submarineboat.com/waterproofing/htm> 2016.
"World Solar Challenge 2017 Regulations", www.worldsolarchallenge.org, Jun. 2016.
"Magnet" from Wikipedia <https://en.wikipedia.org/wiki/magnet>.
"Magnetic Core" from Wikipedia <https://en.wikipedia.org/wiki/Magnetic_core>.
"Neodymium Magnet" from Wikipedia <https://en.wikipedia.org/wiki/Neodymium_magnet>.
Albrecht, et al. "Towards optical optimization of planar monolithic perovskite/silicon-heterojunction tandem solar cells", IOPscience, 2016.
Amadeo "Project Ara—Google's modular smartphone—is dead", ARS Technical <www.arstechnica.com>, Sep. 1, 2016.
Azzolini, "Production and Performance of Cu-based anode-supported tubular IT-SOFCs", University of Trento; Doctoral School of Material Science and Engineering, Dec. 2014.
Berman, "Where's the Affordable Carbon Fiber Automobile?" Sustainable Energy, MIT Technology Review, Aug. 10, 2015, 6 pages.
Boudouris, "Organic Electron Devices", Lecture segment; Nano Hub, Purdue University, Jan. 2015.
Bullis "A Battery To Prop Up Renewable Power Hits The Market", Downloaded from the Internet at <https://www.technologyreview.com/s/532311/a-battery-to-prop-up-renewable-power-hits-the-market> Nov. 14, 2014.
Casey "New 'Super Battery' Energy Storage Breakthrough Aims at $54 per kWh", downloaded from the Internet at <https://cleantechnica.com/2016/02/26/new-energy-storage-solution-could-hit-magic-54-mark> Feb. 26, 2016.
Chi et al., "Battery Charge Depletion Prediction on an Electric Aircraft", NASA Langley Research Center, 2013.
Choi et al. "Conjugated polyelectrolyte hole transport layer for inverted-type perovskite solar cells", Nature Communications, vol. 6, issue 7348, Jun. 17, 2015, 6 pages.
Copper Development Association "A Guide to Working with Copper and Copper Alloys", Antimicrobial Copper, Copper Development Association A1360 XX/10, 2017.
De Almeida et al. "VSDs for Electric Motor Systems", University of Coimbra, 2016.
De Looper "Need More Battery on Your Apple Watch?" Downloaded from the Internet at <www.digitaltrends.com/wearables/apple-watch-modular-bands> Mar. 31, 2016.
DuPont Creative Mechanisms, "Everything You Need To Know About Polycarbonate," 2015; retrieved from the internet on Sep. 26, 2016 from https://www.creativemechanisms.com/blog/everything-you-need-to-know-about-polycarbonate-pc.
DuPont USA, DuPont Frontsheet Materials, DuPont Teflon Films {Teflon Fluoropolymer), 2015; K23269 09/09; 4 pages.

(56) References Cited

OTHER PUBLICATIONS

Electronic paper, Wikipedia, downloaded from the Internet at <https://en.wikipedia.org/wiki/Electronic_paper> 2016.
Eperon et al. "Inorganic caesium lead iodide perovskite solar cells", Royal Society of Chemistry, The Journal of Materials Chemistry, vol. 3 (2015): 19688-19695.
Eveready 1209 Product Datasheet, Form No. EBC-3107F, www.energizer.com (2017); 2 pages.
Fan et al., Microelectronics Reliability, "Experimental investigations and model study of moisture behaviors in polymeric materials," vol. 49, Issue 8, Aug. 2009; 12 pages.
Galvanic corrosion', Wikipedia, downloaded from the Internet at <https://en.wikipedia.org/wiki/Galvanic_corrosion> 2015.
Green Hills, Inc., "Integrity Real-Time Operating System", 2015, retrieved from the Internet on Oct. 2, 2016 from http://www.ghs.com/products.rtos.integrity.html; 4 pages.
Honeywell Aclar® Films, "Honeywell Aclar® UltRx6000", effective date Sep. 19, 2011; 1 page.
International Search Report and Written Opinion for PCT/US2018/019566 dated Jun. 26, 2018; 8 pages.
Jeffrey, "Siemens' world-record electric aircraft motor punches above its weight", blog-New Atlas, Apr. 2015, 4 pages.
Jiang, et al., "Modeling charge polarization voltage for large lithium-ion batteries in electric vehicles", Journal of Industrial Engineering and Management, vol. 6, No. 2 (2013); 686-697.
Johnson, "Nanotube based Li-Ion Batteries Can Charge To Near Maximum In Two Minutes", IEEE Spectrum, blog, Oct. 2014.
Jung et al. "Substantial improvement of perovskite solar cells stability by pinhole-free hole transport layer with doping engineering", Scientific Reports, vol. 5, May 2015; 5 pages.
Kato et al. "Silver Iodide Formation in Methyl Ammonium Lead Iodide Perovskite Solar Cells with Silver Top Electrodes", Advanced Materials Interfaces, vol. 2 (2015), 6 pages.
Krings, "Iron Losses in Electrical Machines—Influence of Material Properties, Manufacturing Processes, and Inverter Operation", KTH School of Electrical Engineering, Doctoral Thesis, 2014; 177 pages.
Lee et al. "Neutral- and Multi-Colored Semitransparent Perovskite Solar Cells", MDPI, Molecules, vol. 21, issue 4 (2016), 55 pages.
Li et al. "High-efficiency robust perovskite solar cells on ultrathin flexible substrates", Nature Communications, 7:10214, Jan. 2016.
LR44 Technical Data Sheet, Renata Batteries Inc., 2002; 1 page.
Luomi, "Efficiency Optimization of a 100-W, 500 000-rpm Permanent-Magnet Machine Including Air Friction Losses", IEEE vol. 45, No. 4, Jul./Aug. 2009; 1368-1377.
Lyu, et al. "Organic-inorganic bismuth (III)-based material: a lead-free, air-stable and solution-processable light-absorber beyond organolead perovskites", Tsinghua University Press, Nano Research, Nov. 2015.
Moldovan et al., "A New 94-GHz Six-Port Collision-Avoidance Radar Sensor", IEEE vol. 52, No. 3, Mar. 2004; 751-759.
Organic electronics, Wikipedia, downloaded from the Internet at <https://en.wikipedia.org/wiki/Organic-electronics> 2016.
Patent Cooperation Treaty: International Search Report and Written Opinion for PCT/US2018/025964 dated Aug. 28, 2018; 15 pages.
Patent Cooperation Treaty: International Search Report and Written Opinion for PCT/US2018/027827 dated Aug. 27, 2018; 16 pages.
Penn Stainless "Duplex 2507 Specifications: UNS S32750", downloaded from the Internet at <www.pennstainless.com> 2016.
Rosu-Hamzescu et al., "Practical Guide for Implementing Solar Panel MPPT Algorithms" Microchip Inc., 2013; 16 pages.
Rudati et al. "The I-V characteristics of organic hole-only devices based on cross-linked hole-transport layer", www.sciencedirect.com, Journal of Applied Research and Technology, vol. 13 (2015): 253-260.
Schwartz, "New perovskite solar cell design could outperform existing commercial technologies, Stanford and Oxford scientists report", www.news.stanford.edu, Oct. 2016; retrieved from the Internet at <https://news.stanford.edu/2016/10/20/perovskite-solar-cell-design-shows-promise/>.
Screw threads', Wikipedia, downloaded from the Internet at <https://en.wikipedia.org/wiki/Screw_thread#Thread_Limit> 2015.
Specification for Lithium Battery, Model: CR2032 Product Specification; Power Glory Battery Tech (HK) Co., Ltd., 2012; 9 pages.
Sun et al. "Discovering lead-free perovskite solar materials with a split-anion approach", Royal Society of Chemistry, Nanoscale, Issue 12, 2015.
Suttman Lithium Ion Battery Aging Experiments and Algorithm Development for Life Estimation, Thesis—Ohio State University, 2011.
Synchronous Optical Network (SONET) Tutorial, Tektronix, 1998 <http://www.webproforum.com/tektronix/full.html>.
Thales "Modular Universal Battery Charger", downloaded from the Internet at <www.thalescomminc.com> 2015.
The Orange solar charger by JOOS; 6 pages; downloaded from the Internet on Apr. 25, 2018 at <http://solarjoos.com/ products>.
Tyva Moduloo Inc. "New generation of modular lithium ion polymer batteries", downloaded from the Internet at <http://www.tyva-ennergie.com/en/moduloo-en/home.html>, 2016.
Valence "Valence Technology: The first scalable large lithium ion battery pack", downloaded from the Internet at <https://www.valence.com/why-valence/modular> 2016.
VanZwol "Designing Battery Packs for Thermal Extremes", Power Electronics, downloaded from the Internet at <http://powerelectronics.com/print/mobile/designing-battery-packs-thermal-exremes> 2016.
Veldhuis et al. "Perovskite Materials for Light-Emitting Diodes and Lasers", ResearchGate, Advanced Materials, vol. 28 (2016); 6804-6834.
Wikipedia, "Fick's Laws of Diffusion," 1855; retrieved from the Internet on Oct. 5, 2016; 11 pages.
Wikipedia, "Shockley-Queisser Limitation," 1961; retrieved from the Internet on Sep. 26, 2016; 14 pages.
Zhao et al. "Is Cu a stable electrode material in hybrid perovskite solar cells for a 30 year lifetime?", Energy & Environmental Science, vol. 9 (2016): 3650-3656.

\* cited by examiner

SOLAR CAR

CROSS REFERENCE TO RELATED APPLICATION

The present application is a continuation in part of U.S. patent application Ser. No. 15/902,961, filed Feb. 22, 2018, which claims priority to U.S. Provisional Application No. 62/462,924, filed Feb. 24, 2017. The present application is also a continuation in part of U.S. patent application Ser. No. 15/944,706, filed Apr. 3, 2018, which claims priority to U.S. Provisional Application No. 62/481,075, filed Apr. 3, 2017. The present application also claims priority to U.S. Provisional Patent Application No. 62/485,396, filed Apr. 14, 2017 and U.S. Provisional Patent Application No. 62/485,399, filed Apr. 14, 2017. Each of these applications are hereby incorporated by reference.

TECHNICAL FIELD

Embodiments herein relate to the field of solar-powered automobiles.

BACKGROUND

Solar cars include solar cells to harvest energy from the sun and use the harvested energy to power an electric motor. Current solar cars include solar cells that are manufactured separately from the rest of the car, and then affixed to the car after the car is manufactured.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

DETAILED DESCRIPTION OF DISCLOSED EMBODIMENTS

Figure 1A:
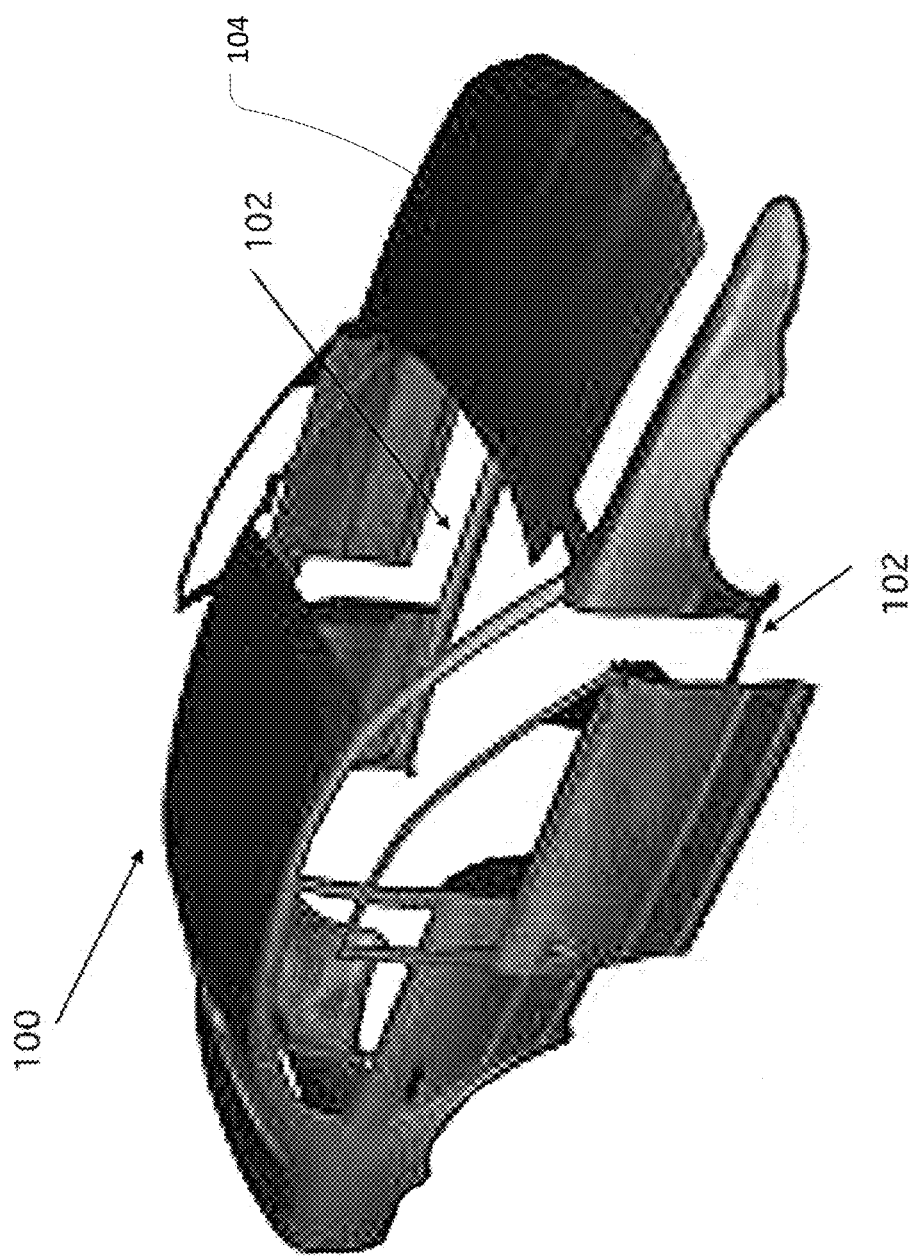
FIG. 1A illustrates a perspective view of example photovoltaic surfaces of a solar car, in accordance with various embodiments.

In the following detailed description, reference is made to the accompanying drawings, which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense.

Various operations may be described as multiple discrete operations in turn, in a manner that may be helpful in understanding embodiments; however, the order of description should not be construed to imply that these operations are order-dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to,"

the term "having" should be interpreted as "having at least," the term "includes" should be interpreted as "includes but is not limited to," etc.).

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, an embedded computer, and so forth. As used herein, the term "solar panel" may refer to, or be part of, more than one solar cell. As used herein, the term "wire" may refer to an insulated wire unless otherwise specified.

Various embodiments provide a solar car that may include a solar cell integrated into one or more panels of the car. The term car, as used herein, may refer to any suitable type of automobile, including a consumer vehicle (e.g., sedan, sport utility vehicle, etc.), commercial vehicle (e.g., delivery truck, tractor trailer, etc.), and/or a recreational vehicle. As discussed above, one or more panels that form the exterior of the solar car may include an integrated solar cell. The one or more panels may include any suitable components of the solar car, such as a roof, hood, trunk lid, door, side panel, windshield, window, sunroof, and/or other body panel.

For example, FIG. 1A illustrates possible photovoltaic surfaces 104 for a solar car 100. The photovoltaic surfaces 104 may be integrated into corresponding car parts (e.g., external car panels). In contrast, exterior car parts of existing vehicles have material surfaces that are typically painted in manners to protect, or otherwise decorate them. The car parts of the solar car 100 may be coupled to a frame 102 of the solar car 100. In some embodiments, the frame 102 may include super duplex stainless steel (which includes 25% or more chromium), regular steel or structurally strengthened aluminum, among other materials.

Figure 1B:
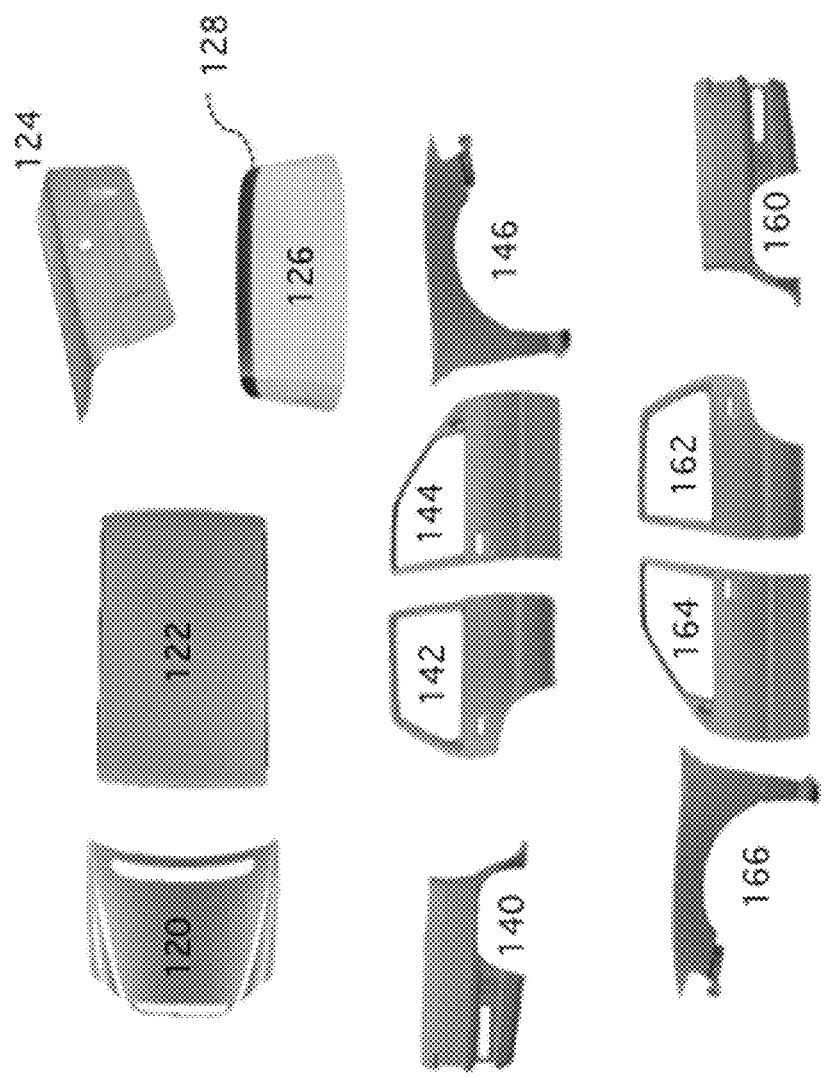
FIG. 1B car panels that may have photovoltaic surfaces for a solar car, in accordance with various embodiments.

FIG. 1B illustrates car panels having possible photovoltaic surfaces for the solar car. Any of these surfaces may be completely used or partially used to generate photovoltaic energy. The car panels 100 shown in FIG. 1 include a roof 122 a trunk lid 124, a hood 120, right rear side panel 140, right rear door 142, right front door 144, right front side panel 146, left rear side panel 160, left rear door 162, left front door 164, and left front side panel 166, and windshield 126. Some of these solar car panels 100 have holes through them, e.g., for a door lock, vents, door handles, and/or windows among functions.

In various embodiments, the car panels may include an integrated solar cell. The solar cell may include a photovoltaic material, and an anode and a cathode coupled to the photovoltaic material. The photovoltaic material may be any suitable type of photovoltaic material, such as perovskite, a thin film (e.g., copper indium gallium selenide (CIGS), cadmium telluride (CdTe), gallium arsenide), silicon, etc. In some embodiments, the solar cell may have a three-dimensional shape that substantially conforms to the shape of the corresponding car panel. In various embodiments, the solar cell may be at least partially encapsulated by one or more encapsulant layers, for example, as further discussed below with respect to FIGS. 2A-2E.

FIG. 1B further illustrates a front windshield 126. The rear windshield and the side/door windows are not shown. The windows and windshields may be transparent. Additionally, the door windows and/or sunroof (if included) may move.

In various embodiments, the windshield 126 may include a transparent thin-film solar cell, with automotive safety glass as the substrate. In some embodiments, the windshield 126 may have a tinted emissivity area 128, e.g., in a top region of the windshield 126. In one non-limiting embodiment, the windshield may include a gallium arsenide thin-film solar cell. The untinted portion of the gallium arsenide thin-film solar cell may perform at about 26% efficiency, while the tinted emissivity area 128, if there is one, may perform at about 28% efficiency. This type of solar cell has a transmissivity of visible light at 550 nm (green) of approximately 80%. The requirement for a street legal windshield is a transmissivity of approximately 70% of green light.

In some embodiments, the tinted emissivity area 128 may not have the same transmissivity requirements as the rest of the windshield 126, enabling different materials to be used in the tinted emissivity area 128 than in the rest of the windshield 126, which can provide higher solar cell efficiency. The tinted emissivity area 128 may be a heterogeneous tandem cell; made of the windshield photovoltaic material, with a specific perovskite layer added. For example, in one non-limiting embodiment, the tinted emissivity area 128 may include a gallium-arsenide perovskite tandem cell.

In some embodiments, the windshield 126, including the tinted emissivity area 128, may be encapsulated with an aqueous solution, such as of sodium silicate ($Na_2O$) and silicon dioxide ($SiO_2$, also referred to as silica). This process both hardens the surface of the photovoltaic material, and protects it from ultraviolet and infrared radiation. One or more anti-reflection layers may be added, which serve to improve the efficiency of the photovoltaic material by capturing the maximum amount of visible light. The anti-reflection layers may include titanium dioxide ($TiO_2$) and silicon dioxide ($SiO_2$), and may be deposited using ultrasonic techniques.

Figure 1C:
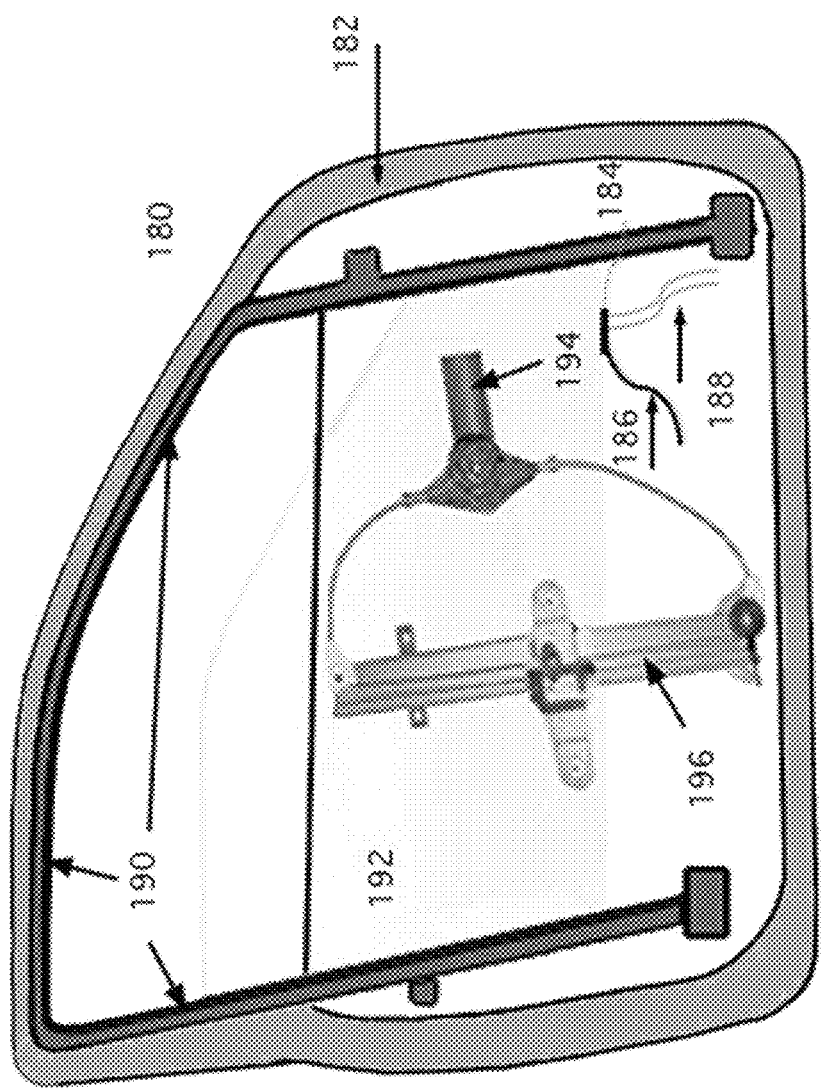
FIG. 1C illustrates a solar car door with a window having a photovoltaic surface, in accordance with various embodiments.

FIG. 1C illustrates the solar car door 180, with the window movement mechanism exposed. In some embodiments, glass in the solar car may be used as a photovoltaic surface, and the windows in the car doors illustrate the more difficult requirement of a sliding solar panel, under motor control. The door may include a doorframe 182 and a photovoltaic window 192. The door 180 may further include electronics 184 for the photovoltaic window 192 and/or a communications cable 186 to route instructions from a central system to the electronics 184 and/or permits the electronics 184 to provide statistics. A window motor 194 and regulator 196 may be used to control raising or lowering the window (e.g., by a switch in the car interior).

The window 192 may be coupled to a channel 190 of the door 180 and may move within the channel 190. The photovoltaic window 192 may include any suitable photovoltaic material, such as a transparent thin film (e.g., gallium arsenide). The photovoltaic material of the window 192 may be encapsulated with an aqueous solution of sodium silicate ($Na_2O$) and silica ($SiO_2$) with anti-reflection layers added. Anode and cathode wires 188 may be coupled to the respective anode and cathode of the photovoltaic window 192.

Figure 2A:
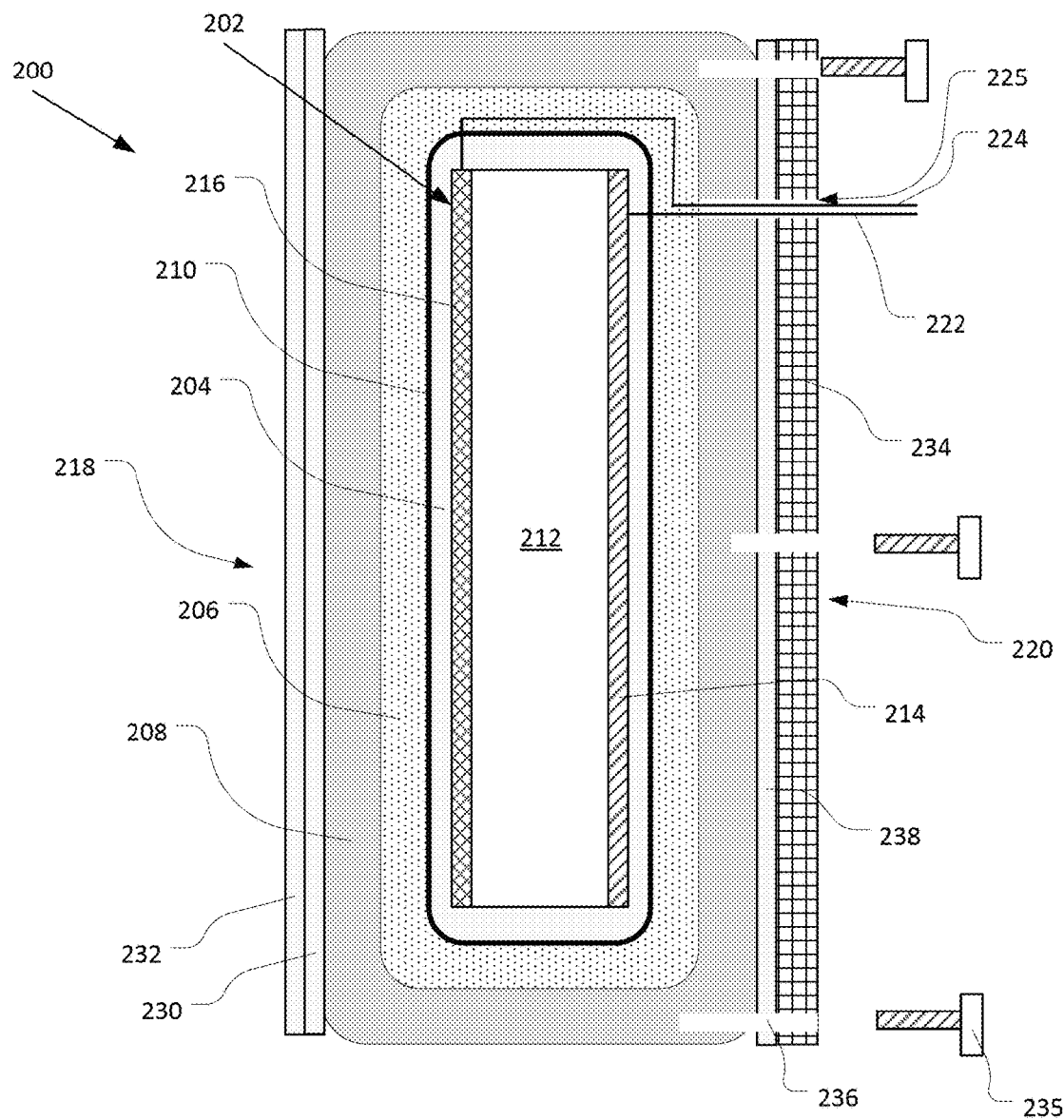
FIG. 2A is a cross-sectional view of a solar car panel, in accordance with various embodiments.
Figure 2B:
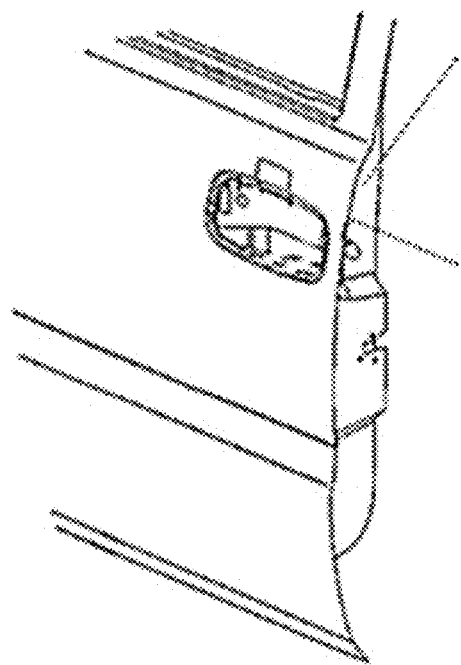
FIG. 2B is a perspective view of a solar car door, in accordance with various embodiments.

FIG. 2A illustrates a cross-sectional view of a solar car panel 200, in accordance with various embodiments. The solar car panel 200 (also referred to as "panel 200") may correspond to any suitable exterior component of the solar car, such as one or more of the solar car panels 100 illustrated in FIG. 1. For example, in some embodiments, the panel 200 may correspond to a left front door, a portion of which is illustrated in FIG. 2B.

In various embodiments, the panel 200 may include a solar cell 202. The solar cell 202 may be at least partially surrounded by a first encapsulant layer 204, and/or a second encapsulant layer 206. The first encapsulant layer 204 is disposed on the solar cell 202 and fully or partially encapsulates the solar cell 202. The second encapsulant layer 206 is disposed on the first encapsulant layer 204 and fully or partially encapsulates the solar cell 202 and the first encapsulant layer 204. In some embodiments, the panel 200 may further include a third encapsulant layer 208 on the second encapsulant layer 206 that fully or partially encapsulates the solar cell 202, the first encapsulant layer 204, and/or the second encapsulant layer 206. The encapsulation of the solar cell 202 by the first encapsulant layer 204, the second encapsulant layer 206 may protect the solar cell 202 from moisture and/or physical deformation, thereby providing the panel 200 with a long usable lifetime.

In some embodiments, an adhesive 210 (e.g., a transparent adhesive) may be disposed between the first encapsulant layer 204 and the second encapsulant layer 206.

In various embodiments, the solar cell 202 may include a photovoltaic material (e.g., perovskite, cadmium telluride, copper indium gallium selenide) 212, an anode 214, and a cathode 216. The anode 214 and cathode 216 may be on opposite sides of the photovoltaic material 212, as shown in FIG. 2, although other configurations are possible. For example, in some embodiments, the cathode 216 may face the outer surface 218 of the panel 200, and the anode 214 may face the interior surface 220 of the panel 200 (e.g., that faces the inside of the solar car).

The panel 200 may further include an anode contact 222 and a cathode contact 224 that are conductively coupled to the anode 214 and cathode 216, respectively, of the solar cell 202. In some embodiments, the anode contact 222 and/or cathode contact 224 may include a conductive wire (e.g., a conductor surrounded by an insulative sheath), as shown in FIG. 2A. In some embodiments, the anode contact 222 and/or cathode contact 224 may extend from the solar cell 202 through the first encapsulant layer 204, and at least partially through the second encapsulant layer 206 and/or the third encapsulant layer 208.

The anode 214 and/or cathode 216 may include any suitable materials. For example, in some embodiments, the anode 214 may include graphite, doped carbon fiber, copper, silver, stanene, praseodymium cerium copper oxide (PCCO) on graphene, germanene on graphene, silicene on graphene, and/or another suitable material. Additionally, or alternatively, the cathode 216 may include a transparent ceramic conductor, such as indium tin oxide (ITO), fluorine doped tin oxide (FTO), and/or another transparent conducting material.

The first encapsulant layer 204 and/or second encapsulant layer 206 may include any suitable material or materials with the desired properties. For example, in some embodiments, the first encapsulant layer 204 is an effective water barrier, and may include polychlorotrifluoroethylene (PCTFE), a fluoropolymer resin, polysiloxanes (e.g., silicone), and/or ethyl vinyl acetate (EVA). Additionally, or alternatively, the second encapsulant layer 206 and/or third encapsulant layer 208 may include polysiloxanes (silicone), EVA, polycarbonate and/or glass. If the second encapsulant layer 206 and/or third encapsulant layer 208 includes glass, the glass may be a low iron glass (e.g., having an iron oxide content of less than 0.02%). Glass containing less iron oxide has a higher solar transmissivity than traditional soda lime glass (e.g., about 91% compared with about 85%), thereby providing greater efficiency for the solar cell. In one non-limiting example, the first encapsulant layer 204 may be PCTFE, the second encapsulant layer 206 may be polysiloxanes (silicone), and the third encapsulant layer 208 may be glass (e.g., low iron glass).

In various embodiments, the first encapsulant layer 204, the second encapsulant layer 206, and/or third encapsulant layer 208 may be transparent to enable sunlight to pass through to the solar cell 202. In one embodiment, the first encapsulant layer 204, second encapsulant layer 206, and third encapsulant layer 208 may have a solar transmissivity of 80% or greater, such as a solar transmissivity of 90% or greater.

In various embodiments, the panel 200 may require a moisture vapor transmission rate (MVTR) for penetration to the solar cell 202 of lower than $10^{-6}$ g/m$^2$/day (day is 24 hours). As described herein, there are several inorganic water-barrier material layers that, when combined, accomplish this. A highly desirable outer layer (e.g., the third encapsulant layer 208) is low iron-glass. Low iron glass is highly insoluble to water, protects the photovoltaic material from ultraviolet radiation, is very strong, and forms a hard surface for the exterior of the car. Inside the outermost encapsulant are the other encapsulates (e.g., the second encapsulant layer 206 and the first encapsulant layer 208). The second encapsulant layer 208 may protect the photovoltaic material from shock (e.g., from vibration or impact). Some photovoltaic materials are crystalline (e.g., perovskites), and therefore more susceptible to damage from shock. Other photovoltaic materials, including thin films such as copper indium gallium selenide (CIGS), or cadmium telluride (CdTe) handle vibration well. An example second encapsulant layer 208 is silicone, which is easy to handle, inert, an excellent water barrier, and a shock absorber. An innermost encapsulant (e.g., the first encapsulant layer 204), adjacent to the photovoltaic material 212, may be an outstanding water barrier, such as a PCTFE film. Before water vapor penetration of the innermost layer, moisture equilibrium in the outer layers must be established (glass and silicone in this case). If MVTR equilibrium is not reached, then the layer is unstable, and the innermost encapsulant remains dry. Once stable, the PCTFE then protects the photovoltaic material according to its MVTR.

In some embodiments, the first encapsulant layer 204 may have a lower permeability to moisture than the second encapsulant layer 206 and/or the third encapsulant layer 208. For example, in some embodiments, the first encapsulant layer 204 may have a moisture vapor transmission rate of less than 0.1 grams per square meter per day (g/m$^2$/day). Additionally, or alternatively, the third encapsulant layer 208 may be stronger (e.g., in tensile strength and/or flexural strength) than the first encapsulant layer 204. For example, the third encapsulant layer 208 may have a tensile strength of greater than 2,000 pounds per square inch, such as a tensile strength greater than 5,000 pounds per square inch. The second encapsulant layer 206 may provide shock absorption and/or other benefits. Together, the first, second and third encapsulant layers create an environment for the solar cell 202 that is highly waterproof, while also being strong, durable, and protective of the photovoltaic material.

The panel 200 may be formed by any suitable process. For example, in some embodiments, the first encapsulant layer 204, second encapsulant layer 206, and/or third encapsulant layer 208 may be applied to the solar cell 202 in liquid form and heat compressed to harden around the solar cell 202. In some embodiments, a closed tube of the material of the first encapsulant layer 204 may be heat compressed to tightly fit to the solar cell 202. The manufacturing method may prevent pinholes from forming in the first encapsulant layer 204, second encapsulant layer 206, and/or third encapsulant layer 208, which may otherwise be a source of moisture intrusion.

In some embodiments, the third encapsulant layer 208 may be formed around the solar cell 202 using microelectromechanical systems (MEMS) techniques and/or nanotechnology to join two or more portions of the third encapsulant layer 208. For example, surfaces of the material of third encapsulant layer 208 that are to be joined may be prepared for bonding by etching or another suitable process and then joined together to form a strong and watertight bond.

Figure 2D:
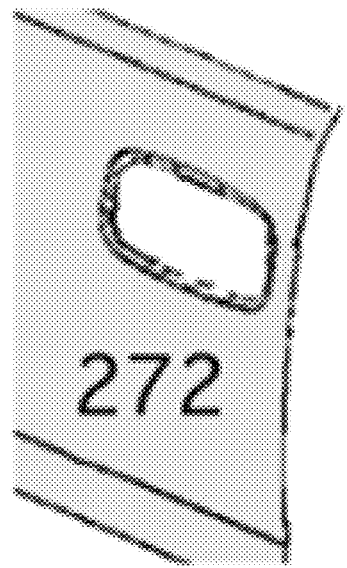
FIG. 2D illustrates an anode for a solar car door, in accordance with various embodiments.
Figure 2C:
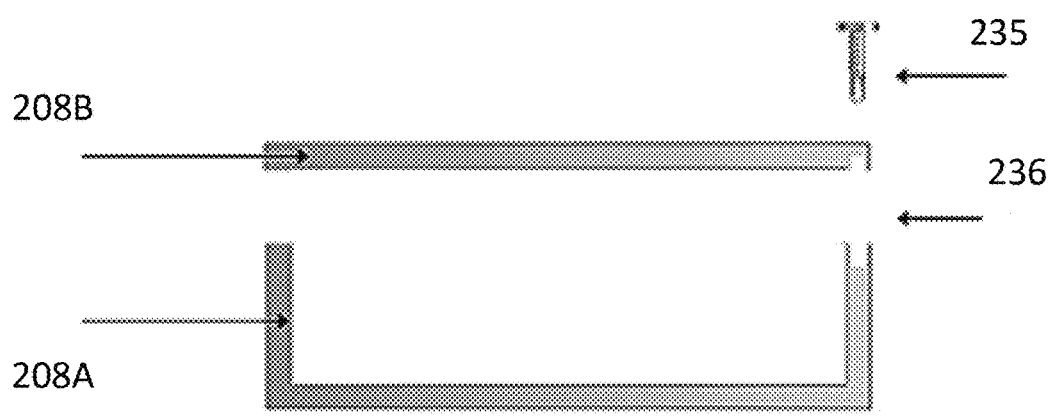
FIG. 2C illustrates two portions of an outer (e.g., third) encapsulant layer that may be bonded together, in accordance with various embodiments.

FIG. 2C illustrates two portions 208A and 208B of the third encapsulant layer 208 that may be bonded together using MEMS techniques, in accordance with various embodiments. The portion 208A may face the exterior of the solar car, while the portion 208B may face the interior of the solar car. The portions 208A and 208B may or may not be the same material. For example, in some embodiments, the portions 208A and 208B may be different types of glass. In one non-limiting embodiment, the portion 208A may be low iron glass, and the portion 208B may be architectural glass. Architectural glass defined herein is a laminated glass, used in the automotive and architectural fields, and comprises a protective interlayer, usually polyvinyl butyral or EVA, bonded between two panels of glass. Aluminum may also be used to improve strength under deformation, and reduce weight. The bonding process takes place under heat and pressure and under these conditions, the interlayer becomes optically clear and binds the two panes of glass together.

In practice, the interlayer provides various beneficial properties to laminated glass panes. For example, the interlayer functions to distribute impact forces across a greater area of the glass panes, thus increasing the impact resistance of the glass. Additionally, the interlayer functions to bind the resulting shards if the glass is ultimately broken. Furthermore, the interlayer undergoes deformation during impact, and, under static loads after impact, absorbs energy and reduces penetration by the impacting object as well as reducing the energy of the impact that is transmitted to impacted object (e.g., a passenger in a car crash in the case of a car).

Once the photovoltaic material is encapsulated with the first encapsulant layer 204 (e.g., PCTFE), it is quite strong and easily handled. The photovoltaic material encapsulated by the first encapsulant layer 204 may be placed in a reservoir of the second encapsulant material (e.g., silicone) within the portion 208A. The other portion 208B may be bonded to the portion 208A, e.g., using MEMS bonding on the glass-to-glass surfaces. The anode contact/wire 222 and/or cathode contact/wire 224 may extend through a thru-hole 225 in the encapsulant layers 204, 206, and/or 208. The interior of the third encapsulant layer 208 (e.g., around the solar cell 202 and first encapsulant layer 204) may be filled with the material of the second encapsulant layer 206 after the portions 208A and 208B are bonded together. For example, the material (e.g., silicone) may be deposited in the area between the third encapsulant layer 208 and the first encapsulant layer 206 through a hole in the third encapsulant layer 208 (e.g., the access hole 225 through which the anode wire 222 and cathode wire 224 are passed through, or another access hole) under a vacuum. In some embodiments, the access hole 225 may be filled with a fill material, such as sodium silicate ($Na_2Si_3$, also known as waterglass or liquid glass), after depositing the material of the second encapsulant layer 206 through the access hole 225.

While the panel 200 is shown in FIG. 2A with both first encapsulant layer 204 and second encapsulant layer 206 fully encapsulating the solar cell 202, in other embodiments, one or both of the first encapsulant layer 204 and second encapsulant layer 206 may only partially encapsulate the solar cell 202 (e.g., leaving a portion of the underlying layer exposed). It will be understood that in some embodiments one or more electrical wires (e.g., the anode wire 222 and/or cathode wire 224) may extend through the first encapsulation layer 204 or second encapsulation layer 206. The penetration of the electrical wires (e.g., the conductive wire and surrounding insulation) does not negate the full encapsulation.

In various embodiments, one or more anti-reflection (AR) coatings may be coupled to an exterior surface of the third encapsulant layer 208. One example of a simple anti-reflective coating is a single thin layer of transparent material with refractive index equal to the square root of the substrate's refractive index. While relatively efficient, for photovoltaic applications a single AR material layer is not optimal. Mathematically optimal AR coatings are possible for photovoltaic applications, but they require two or more layers. One example of a two-layer optimal AR coating uses the materials titanium dioxide and silicon dioxide.

For example, FIG. 2A illustrates a first AR coating 230 on the exterior surface of the third encapsulant layer 208 and a second AR coating 232 on the first AR coating 230. In some embodiments, the first AR coating 230 may include titanium dioxide ($TiO_2$), and/or the second AR coating 232 may include silicon dioxide ($SiO_2$). The first AR coating 230 and/or second AR coating 232 may have any suitable thicknesses. For example, in one non-limiting embodiment, an optimal AR coating has the first AR coating 230 may have a thickness of 18.0 nm, and the second AR coating 232 may have a thickness of about 40.7 nm.

The AR coatings 230 and/or 232 may be applied by, for example, ultrasonic spray and vacuum hardened. The third encapsulant layer 208 (e.g., low iron glass) may have transparent polycarbonate added, so the exterior of the car behaves like safety glass. If a glass panel suffers structural damage, it will develop spider cracks and not shatter into large dangerous pieces. If the damage is enough to destroy the glass, it will shatter into tiny pieces. As each solar panel is electrically isolated from the others, damage to one panel, rendering it ineffective, will not affect the other panels from producing electricity in sunlight.

In various embodiments, the exterior surface 218 of the panel 200 may be shaped (e.g., curved) to form the shape of the corresponding component of the solar car (e.g., the door, as shown in FIG. 2B). In some embodiments, the anode 214 of the solar cell 202 may also be shaped (e.g., curved) to match the shape of the component of the solar car. For example, FIG. 2D illustrates an anode 272 in a shape of a car door that may correspond to the anode 214 of solar cell 202 in some embodiments. The anode 240 may be substantially the size of the car's door, or split into smaller cells, effectively tiling the car door. It will be apparent that one or more other components of the panel 200 (e.g., the photovoltaic material 212, cathode 216, first encapsulant layer 204, second encapsulant layer 206, and/or third encapsulant layer 208) may also be curved in the shape of the car component. Some photovoltaic materials, such as thin films and/or perovskites, may be particularly suitable for manufacture of solar panels in the shape of the car part.

In some embodiments, the photovoltaic material 212 may be formed on the anode 240 (e.g., using the anode 240 as the substrate). Accordingly, the photovoltaic material 212 may also have a shape that corresponds to the shape of the car part. In some embodiments, a support material (e.g., PCTFE) may be coupled to the backside of the anode 240 to support and maintain the shape of the anode 240 while the photovoltaic material 212 is applied. The cathode of the solar cell may be applied to the opposite side of the photovoltaic material 212 from the anode 240 (e.g., to face the exterior of the solar car).

As discussed above, in some embodiments, the photovoltaic material 212 may be a homogenous perovskite tandem cell, which absorbs light across the visible spectrum. The Shockley Queisser efficiency limit (SQ limit) refers to the maximum theoretical efficiency using a single p-n junction. With perovskites, limitation on such a cell is 68% with any number of p-n junctions. This works with perovskites because they are transparent, and may be tuned to absorb at different light frequencies. The practical limitation of a homogenous perovskite tandem cell is likely to be around 50% to 55%. This is twice the efficiency of our purest monocrystalline silicon, which has reached its practical SQ limit.

In various embodiments, the panel 200 may further include a support structure 234 that is coupled to the interior surface of the third encapsulant layer 208 (e.g., to the portion 208B). The support structure 234 may be any suitable material, such as aluminum, steel, etc. The support structure 234 and third encapsulant layer 208 may be coupled together, for example, by one or more screws 235 that extend in holes 236, and/or by a bonding layer 238 disposed between the support structure 234 and the third encapsulant layer 208. The bonding layer 238 may be, for example, an adhesive such as a glass/aluminum adhesive. Alternatively, or additionally, the bonding layer 238 may correspond to a MEMS or nanotechnology bond between the interior surface of the third encapsulant layer (e.g., structural glass) and the support structure 234 (e.g., aluminum).

Table 1 below illustrates, for one example of the panel 200, representative cross-sectional thicknesses of various components. It will be apparent that the thickness values are approximate, and that other embodiments may include different thicknesses, materials, and/or components. With the example values, the total thickness is 7.374 mm or about 0.29".

TABLE 1

| Component (with example material) | Range of thickness in mm | Example thickness in mm |
|---|---|---|
| Third encapsulant (e.g., low iron glass) (front) | 0.5 to 4.0 | 2.00 |
| Second encapsulant (e.g., transparent silicone) (front) | 0.25 to 2.0 | 1.50 |
| First encapsulant (e.g., PCTFE) (front) | 0.037 to 0.5 | 0.037 |
| Photovoltaic material (e.g., perovskite crystal) | 0.185 to 0.3 | 0.2 |
| First encapsulant (e.g., PCTFE) (back) | 0.037 to 0.5 | 0.037 |
| Second encapsulant (e.g., transparent silicone) (back) | 0.25 to 2.0 | 1.5 |

TABLE 1-continued

| Component (with example material) | Range of thickness in mm | Example thickness in mm |
|---|---|---|
| Third encapsulant (e.g., structural glass) (back) | 0.5 to 100 | 2.00 |
| Bonding layer (e.g., aluminum - glass adhesive) | 0 to 0.1 | 0.1 |
| total thickness | | 7.374 |

In some embodiments, the second encapsulant layer 206 may have a variable thickness around different portions of the solar cell 202. For example, the second encapsulant layer 206 may be thicker on the interior side that faces the inner surface 220 than on the exterior side that faces the outer surface 218. The lower thickness of the second encapsulant layer 206 on the exterior side may enable higher transmission of solar energy to the solar cell 202, while the higher thickness of the second encapsulant layer 206 on the interior side may provide greater protection for the solar cell 202 from shock/vibration, such as from door/trunk closing and/or other causes. In some embodiments, the solar cell 202 may be held in a desired position within the third encapsulant layer 208 (e.g., by small standoffs) while the material (e.g., silicone) of the second encapsulant layer 206 is pumped into the region between the third encapsulant layer 208 and the first encapsulant layer 204.

Figure 2E:
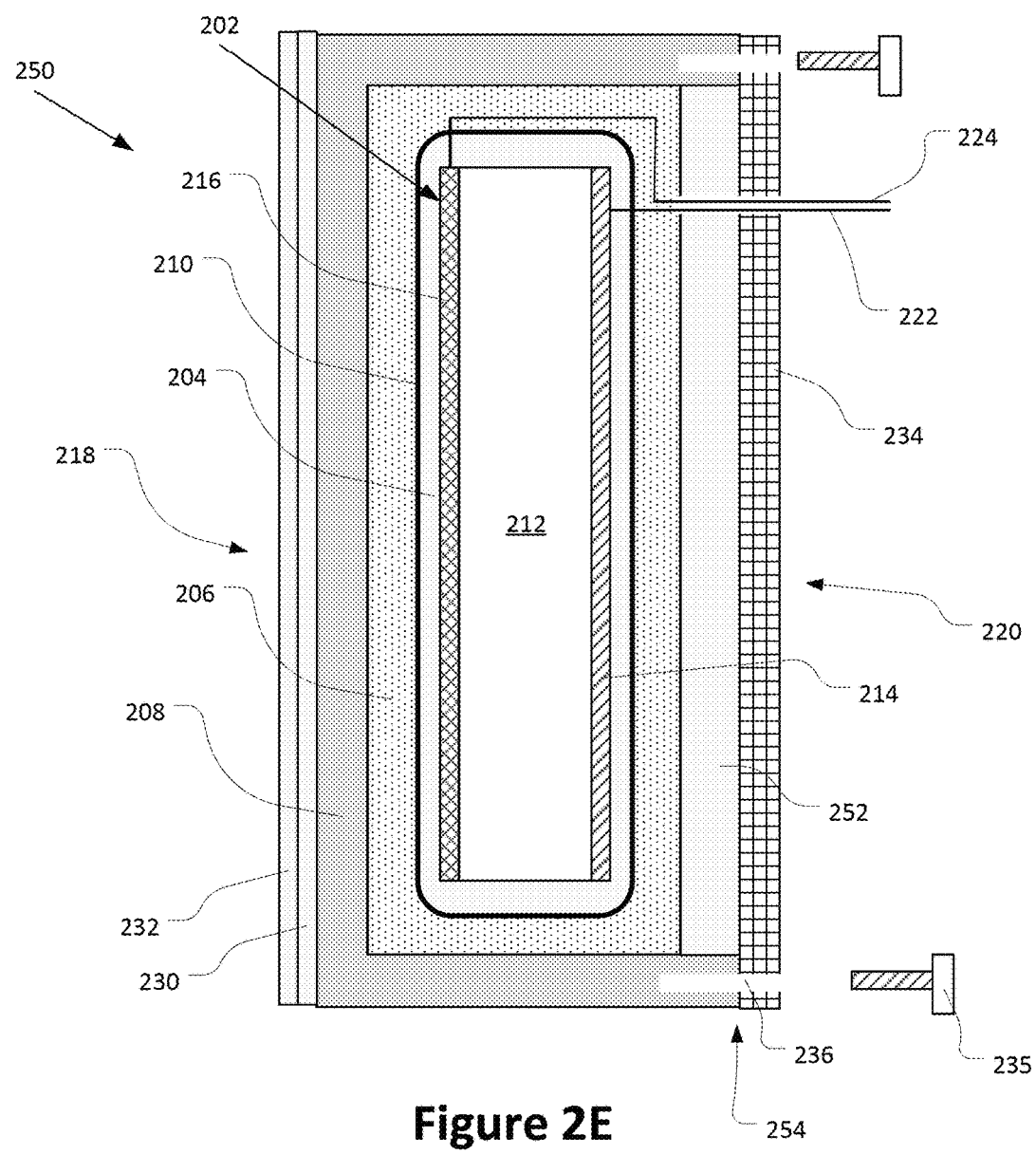
FIG. 2E illustrates a cross-sectional view of another solar car panel, in accordance with various embodiments.

FIG. 2E illustrates a cross-sectional view of another type of solar car panel 250 in accordance with various embodiments. The solar car panel 250 may be similar to the solar car panel 200, except that the third encapsulant layer 208 does not fully encapsulate the solar cell 202, leaving the interior surface of the second encapsulant layer 206 exposed. The support structure 234 may be directly coupled to the interior surface of the second encapsulant layer 206 by a bonding layer (e.g., adhesive) 252. In addition to or instead of the screws 235 coupling the support structure 234 to the second encapsulant layer 208, a MEMS bond may also be formed between the support structure 234 and second encapsulant layer 208 (e.g., at interface 254).

Figure 2F:
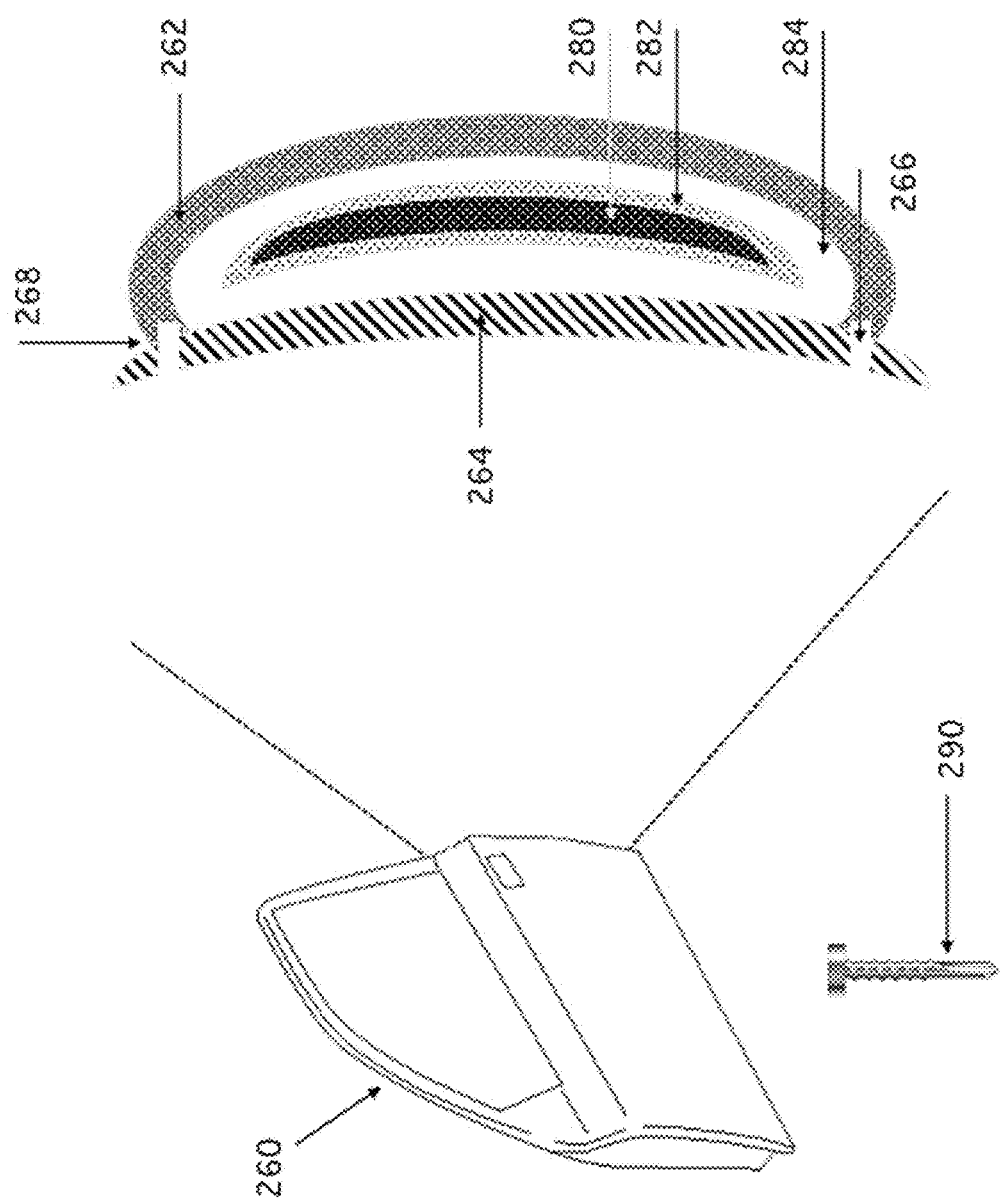
FIG. 2F illustrates a cross-sectional view of yet another solar car panel, in accordance with various embodiments.

FIG. 2F illustrates a perspective view and a cross-sectional view of the right front door of a solar car, manufactured as a solar panel, in accordance with various embodiments. The car doorframe 260 is shown, and uses hinges to attach to the car frame. Needed to complete the door are the window and lock mechanisms, and the electrical integration for the solar panel, lock, and window mechanism. The door may be made of two distinct types of glass, as described herein. The first portion 262 of glass is the exterior of the door and may be made from high transmissivity low iron glass. The first portion 262 of glass may be a type of safety glass, containing polycarbonate, or similar material making the exterior glass safe under a deformation or shock sufficient to destroy the first portion 262 of glass. When this occurs the glass shatters into small pieces.

The second portion 264 of glass may be a type of architectural glass. Architectural glass is glass that has been reinforced in some manner to improve strength and safety when involved in a crash, as well as lighten the solar car weight. In some embodiments, the glass of second portion 264 may be a laminated composite of glass and aluminum. The glass may be reinforced fibers that are flattened into a sheet, arranging the long direction of the fibers in the expected direction of shocks and impacts. This makes a laminated aluminum glass composite, much more resistant to material deformation without shattering. The fibers are thermoset in an epoxy or other thermoplastic binding agent. The laminated layers may be thermoset.

The architectural glass and the low iron solar glass may be bonded together using MEMS technology along with nanotechnology to weld the two glass edges together. The MEMS/nanotechnology joint is shown at 268. MEMS in its most general form are miniaturized mechanical and electromechanical elements made using micro-fabrication. For example, three-dimensional holes are etched into the architectural glass, with matching bulges on the low iron glass. To bond the glasses together, techniques may use fusion, molecular, and/or anodic bonding. For example, using a combination of molecular and anodic bonding, an electric field is used to drive sodium atoms ($^+$Na) from the glass to glass interface. Using nanotechnology, a hydroxyl ($^-$HO) wash is applied to both surfaces. This hydroxyl wash covers the complete interface between the two glasses that are then pressed together, and set using heat. The micro-fabrication with hydroxyl wash bonds the glasses together irreversibly, and barring defects, presents no opportunity for water ($H_2O$) in the form of water vapor transmission, to penetrate the bond.

The glass surfaces are bonded using advanced technology as shown at 268. The glass sections of the door 260 may also be joined together using setscrews 290. These screws 290 physically connect the first portion 262 and second portion 264 together using a pilot hole 266. The pilot hole 266 guides the setscrew 290 and helps to make a secure attachment between the two glass surfaces. In this manner, the exterior part of the solar cell has three mechanisms of bonding the two door halves together; micro-fabrication, hydroxyl radical wash, and setscrews. The setscrews 290 may also perform a safety function in the event of a crash. Deformation, strong enough to overcome the micro-fabrication-hydroxyl bond (which is stronger than steel), may be prevented from shearing into large pieces by the setscrews 290.

The photovoltaic element 280 may be a homogeneous perovskite tandem cell, a heterogeneous tandem cell (perovskite and CIGS, perovskite and CdTe), or a flexible thin film such as CIGS or CdTe. The photovoltaic element may consist of solar sub-cells, or solar cells that make up the entire surface of the door 260. The exterior surface of the door 260 may have a door guard, or a kick plate installed if desired. A water barrier 282 (e.g., first encapsulant layer) is shown around the photovoltaic material 280. The material used for the water barrier 282 may be PCTFE. Surrounding the PCTFE layer is a second encapsulant layer 284, e.g., silicone (polysiloxanes). Silicone polymers constructed from inorganic-organic monomers. Silicones have in general the chemical formula $X_2SiO$, where X is a methyl, ethyl, or from a phenyl group.

Silicone is a good water barrier and it is vacuum set, to fill the interior chamber 284 holding the photovoltaic material. Silicone may be used because it is inert and a good shock absorber. A standoff may be used to orient the photovoltaic material such that the depth of silicone is increased where stress due to shocks, are expected. For car doors, the bottom edge will receive shocks from terrain, and doors will receive shocks from closing. Accordingly, the silicone may be thicker on the interior side and/or top of the car door than on the exterior side and/or bottom. As another example, the roof receives shocks for the most part, only along the bottom, and thus the silicone may be thicker on the bottom of the roof than on the top of the roof.

The exterior surface 262 of the car door 260 may have AR layers (not shown) applied, improving the transmissivity (e.g., by 3% to 5%). The AR layers may be the same as those previously described with respect to FIG. 2A.

In various embodiments, the solar car may include instrumentation to monitor and/or provide various types of information, such as alarms, alerts, and/or news. Alarms are indications of issues the driver must remedy. Alarms may include, but are not limited to, events such as a flat tire, an approaching pothole, a battery that is almost empty, excessive speed for a given environmental condition, or a technologic failure of some part of the solar car. It should be obvious that many other alarms are possible. Alerts indicate something of interest has happened. An example of this may be the battery having 10% charge left. News may include other information that informs the driver in some manner. Non-limiting examples of news are: vehicle speed, environmental temperature, battery state of charge, road conditions, a text is received, and so forth.

Figure 3:
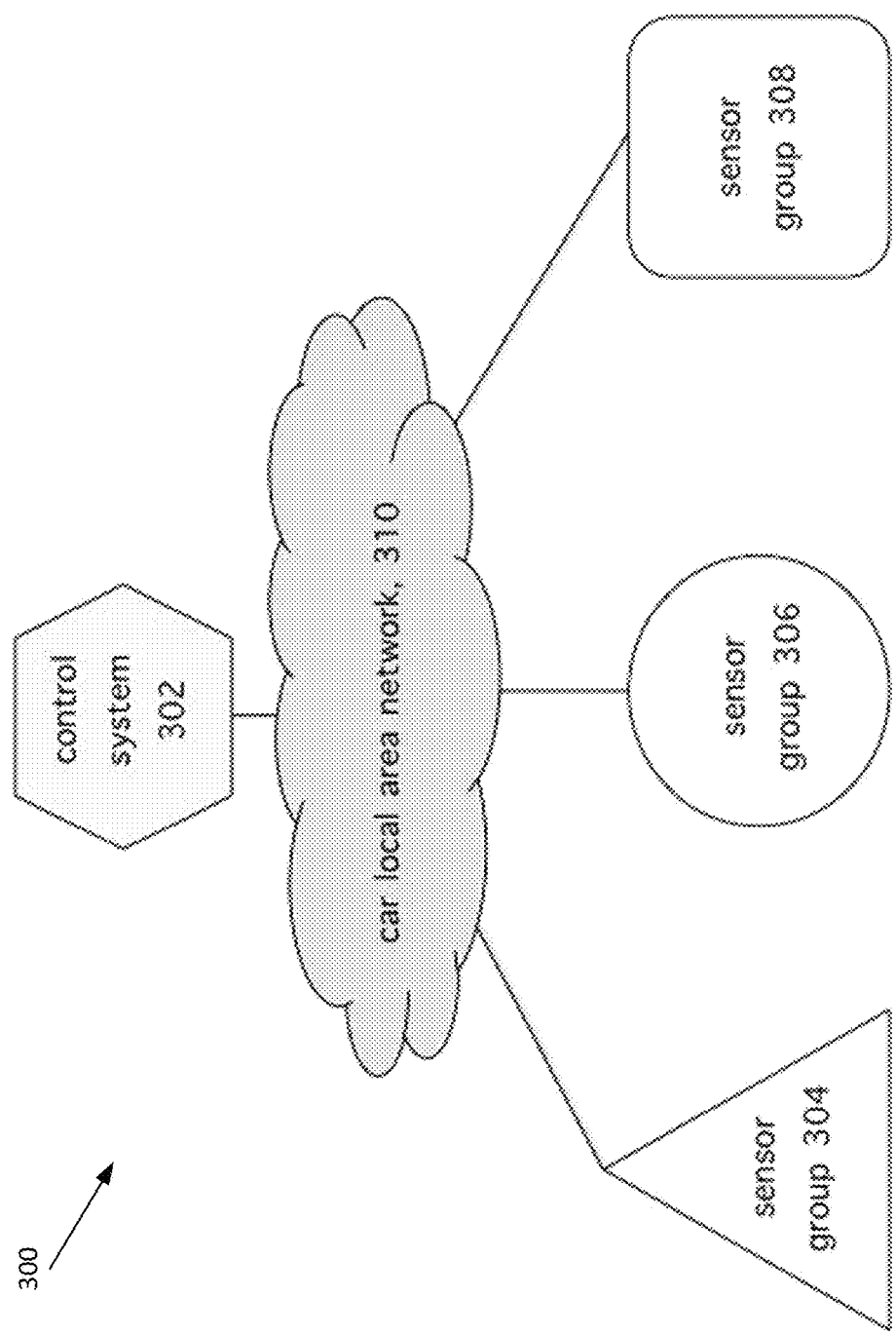
FIG. 3 schematically illustrates a control system for a solar car, in accordance with various embodiments.

FIG. 3 schematically illustrates a control system 300 for a solar car, in accordance with various embodiments. The control system 300 may include control circuitry 302 that includes one or more processors. The control circuitry 302 may be coupled to a plurality of sensors to receive information from the sensors and/or control operation of the sensors. In some embodiments, the sensors may be grouped into one or more groupings based on the bandwidth, latency and/or other requirements of the sensors. For example, the sensors may include sensors 304, sensors 306, and sensors 308. The control circuitry 302 may communicate with the different groups of sensors using different bandwidth, latency, communication interface, and/or other parameters.

For example, in some embodiments, the sensors 304 may include RADAR (radio detection and ranging), LIDAR (light detection and ranging), and visual (e.g., optical) sensors. These sensors may require high bandwidth in the uplink direction from the sensors to the control circuitry 302. For example, in some embodiments, the sensors 304 may be able to communicate with the control circuitry 302 at bandwidth of 100 megabits per second (mbps) or more. However, some or all of these sensors may not require downlink communication (e.g., from the control circuitry 302 to the sensors) to have as high bandwidth.

The sensors 306 may include, for example, battery system sensors, photovoltaic system sensors, electric engine sensors, and/or car system sensors. The battery system sensors may monitor the operation and/or health of the battery (e.g., that is powered by the solar cells and used to power the car engine). The photovoltaic system sensors may monitor the operation and/or health of the solar cells. The electric engine sensors may monitor the operation and/or health of the electric engine. The car system sensors may monitor one or more other systems of the car, such as heating/cooling systems, air circulation, media presentation systems, etc. In some embodiments, the sensors 306 may be able to communicate with the control circuitry 302 at a lower bandwidth than the sensors 304, such as a bandwidth of about 100 kilobytes per second (kbps).

The sensors 308 may include, for example, an accelerometer, stress transducers, environmental sensors (e.g., humidity, temperature, and/or barometric pressure), light sensors (e.g., for the exterior and/or interior lights of the car), tire pressure sensors, driver vitals sensors, and/or communication systems sensors. In some embodiments, the stress transducers may be located at various locations in the vehicle (e.g., in areas that are susceptible to mechanical stress), and may detect a structural defect and/or mechanical stress that occurs. The driver vitals sensors may monitor information associated with the driver, such as pulse, temperature, etc. The communication systems sensors may monitor status of one or more external communication systems, such as Wi-Fi, cellular, etc. In some embodiments, the sensors 308 may be able to communicate with the control circuitry 302 with a bandwidth that is between that of the sensors 304 and 306, such as about 1 megabit per second (mbps).

In various embodiments, the control circuitry 302 may convey information to the user (e.g., driver and/or passenger) of the solar car in various ways, including auditory, tactile, or visual presentation. In some embodiments, metadata (data about data) may be used to convey information. False-colored metadata is useful in communicating complex information quickly to the driver. Examples of this are battery health, operational performance of all systems, optimal engine/terrain/battery performance, and others.

The sensors may be coupled to the control circuitry 302 by a car local area network (LAN) 310, which may implement any suitable interface, such as a wired interface (e.g., electrical and/or superconducting wires), a wireless interface, and/or an optical interface. For example, in some embodiments, the sensors may be coupled to the control circuitry 302 by superconducting wire (e.g., insulated stanene), ultrafine silver wire (by definition 99.99% pure Ag), and or oxygen free copper wire (99.99% pure Cu). Additionally, the sensors may communicate with the control circuitry 302 using any suitable communication protocol, such as telecommunications control protocol/internetworking protocol (known by TCP/IP), simple mail transfer protocol (SMTP), real time streaming protocol (RTSP), and/or message queuing telemetry transport (MQTT).

In some embodiments, the control system 300 may further include a network interface (not shown) coupled to the control circuitry 302 to enable the control circuitry 302 to communicate with one or more other systems of the solar car and/or one or more external devices (e.g., other cars, a control entity, and/or another external device). The network interface may use any suitable networking protocol, including a wireless communication protocol such as cellular communications, Wi-Fi, etc.

Figure 4:
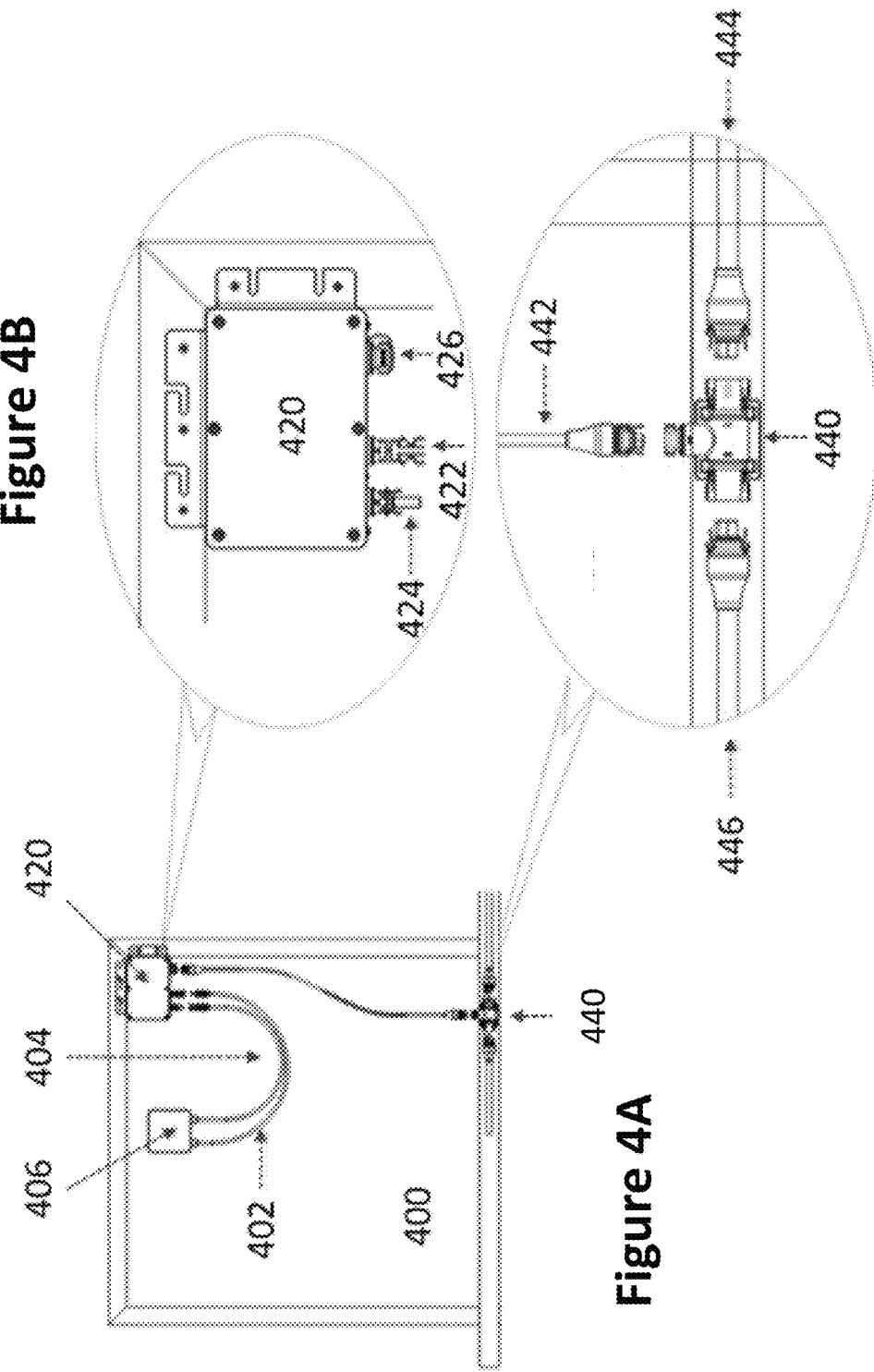
FIG. 4A shows a solar car panel 400 to illustrate interconnection of the integrated solar cell, in accordance with various embodiments.
FIG. 4B illustrates an expanded view of the direct current (DC) power converter of FIG. 4A, in accordance with various embodiments.
FIG. 4C illustrates an expanded view of the DC power combiner of FIG. 4A, in accordance with various embodiments.

FIG. 4A shows a solar car panel 400 to illustrate interconnection of the integrated solar cell, in accordance with various embodiments. The car panel 400 may include an integrated solar cell, for example as shown and described with respect to FIGS. 2A-2E. The car panel 400 is shown as an abstract square shape in FIG. 4A. However, in practice the car panel 400 may be any suitable shape (e.g., corresponding to an exterior component of the car). The solar car panel 400 may include an anode wire 402 and a cathode wire 404 that electrically coupled to the respective anode and cathode of the solar cell (e.g., via connector element 406).

The anode wire 402 and cathode wire 404 may be conductively coupled to a direct current (DC) power converter 420. The solar car may operate on DC power, and may not convert the DC power to alternating current (AC) power. The DC power converter 420 may determine and/or set the maximum power point for the solar cell. This is beneficial as the power generated is often far below the maximum possible. The maximum power point may be derived and set using a single-ended primary-inductor converter (SEPIC). This type of flyback transformer permits the output voltage to range higher or lower than the input voltage, which may be required.

FIG. 4B illustrates an expanded view of the DC power converter 420. The DC power converter 420 may be coupled to the anode wire 402 of the solar cell via terminal 422 and may be coupled to the cathode wire 404 of the solar cell via terminal 424. The DC power converter 420 may generate an output signal from the signals on the anode wire 402 and cathode wire 404 and pass the output signal at an output terminal 426. The output signal may be a DC power signal at the maximum power point of the solar cell.

The DC power converter 420 may run off power from the solar panel, and does not require external power. The DC power converter 420 may be controlled by logic under software control. An example algorithm that may be used for maximum power point tracking is incremental conductance. If such a minimum voltage is not present, a hardware solution, based upon the solar panel's open circuit voltage (OCV) may be used. OCV is a voltage that is not connected to any load in a circuit.

On average the OCV is approximately 70% of the maximum power point. Accordingly, the hardware solution may use this relationship to set the maximum power point. Unfortunately, the average is frequently wrong, and often by a large percentage. Accordingly, when the minimum operating voltage for the circuitry of the DC power converter 420 is reached, stored program control generates the maximum power set point voltage for the DC power converter 420.

The panel 400 may further include a DC power combiner 440 to combine DC power signals from multiple panels and pass the combined DC power signal to the battery to charge the battery. FIG. 4C shows an expanded view of the DC power combiner 440. The DC power combiner 440 may receive the output signal from the panel 400 (e.g., from the DC power converter 420) at input 442 and may receive an output signal from one or more other panels at input 444. The DC power combiner 440 may combine the input signals and generate an output DC power signal at input 446.

In some embodiments, the DC power combiner 440 may combine the input signals in series, adding the voltages of the input signals together. Alternatively, the DC power combiner 440 may combine the input signals in parallel, adding the currents of the input signals together. Until recently, a higher voltage would mean a higher efficiency of power transmission. Now, with the availability of room-temperature superconductors, this is no longer true, enabling the output signals from different solar car panels to be combined in parallel.

The output signal at 446 may be passed to the battery to charge the battery. In some embodiments, the output signal from DC power combiner 440 may be combined with the output signal from one or more other solar car panels (e.g., by other DC power combiners) before being passed to the battery. In some embodiments, a combination of DC power combiners that perform parallel or series combining may be used. Additionally, or alternatively, in some embodiments, the output signal of one or more of the solar car panels may be coupled directly to the battery without being combined with another output signal.

Figure 5:
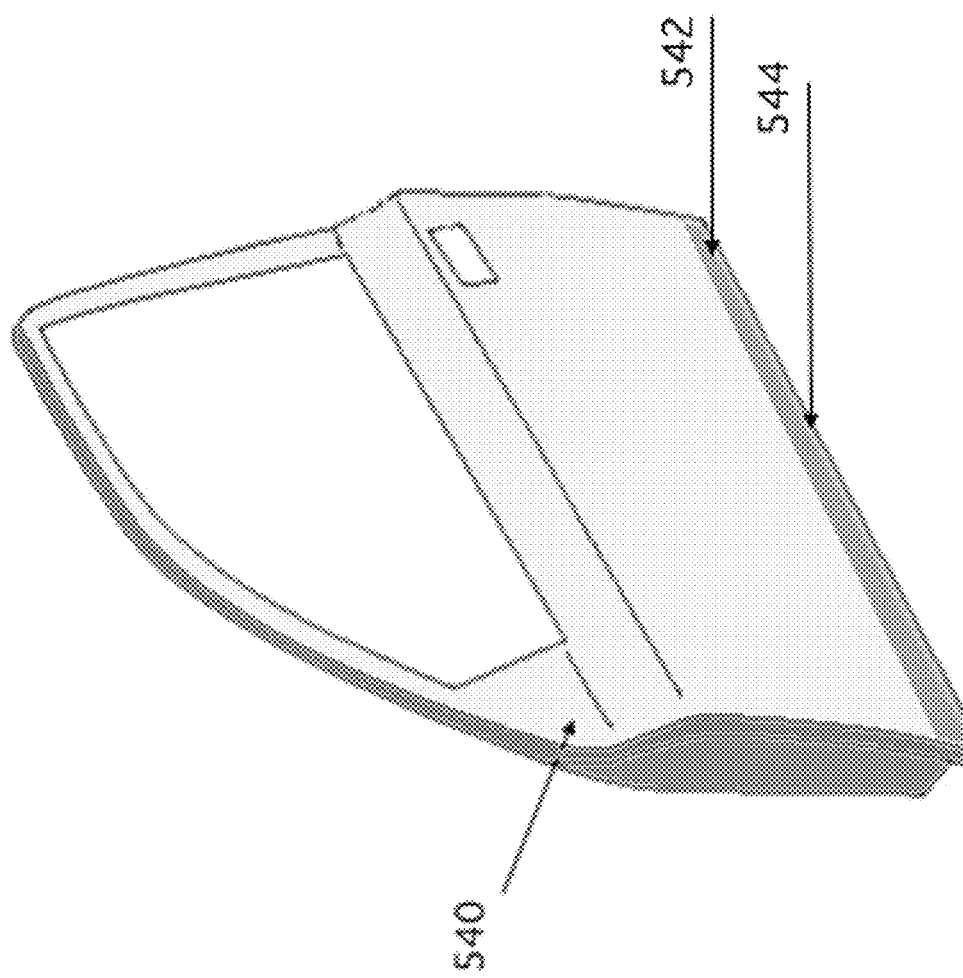
FIG. 5 illustrates a superconducting anode 540 of a solar car door, in accordance with various embodiments.

FIG. 5 illustrates a superconducting anode 540 of a solar car door, in accordance with various embodiments. The anode 540 is electrically connected to a conductive strip 542, which may be OF copper or another suitable conductor. The conductive strip 542 may be needed as the electrons in the superconductor of the anode 540 will travel in more or less straight lines, reaching all along the conductive strip 542. As the electrons all are headed to the battery, the required width of the conductive strip 542 may need to widen in a direction toward the battery for both thermal reasons, and to accommodate the current. Accordingly, in some embodiments, the conductive strip 542 may have a trapezoid shape, with the wide end closer to the battery. The wide end may terminate, for example, in a 6, 8, or 10 gauge wire. In other embodiments, the conductive strip 542 may have a rectangular shape or another suitable shape. The conductive strip 542 may be along the bottom edge 544 of the door, as shown in FIG. 5, or in another area of the anode 540. In some embodiments, the conductive strip 542 may be located further up the door, and the area below the conductive strip may not be photovoltaic. For example, this area may have door edge guards, or materials to prevent scratches and marks made by the door opening and contacting another surface (another car, an interior parking garage wall, and so forth).

Figure 6:
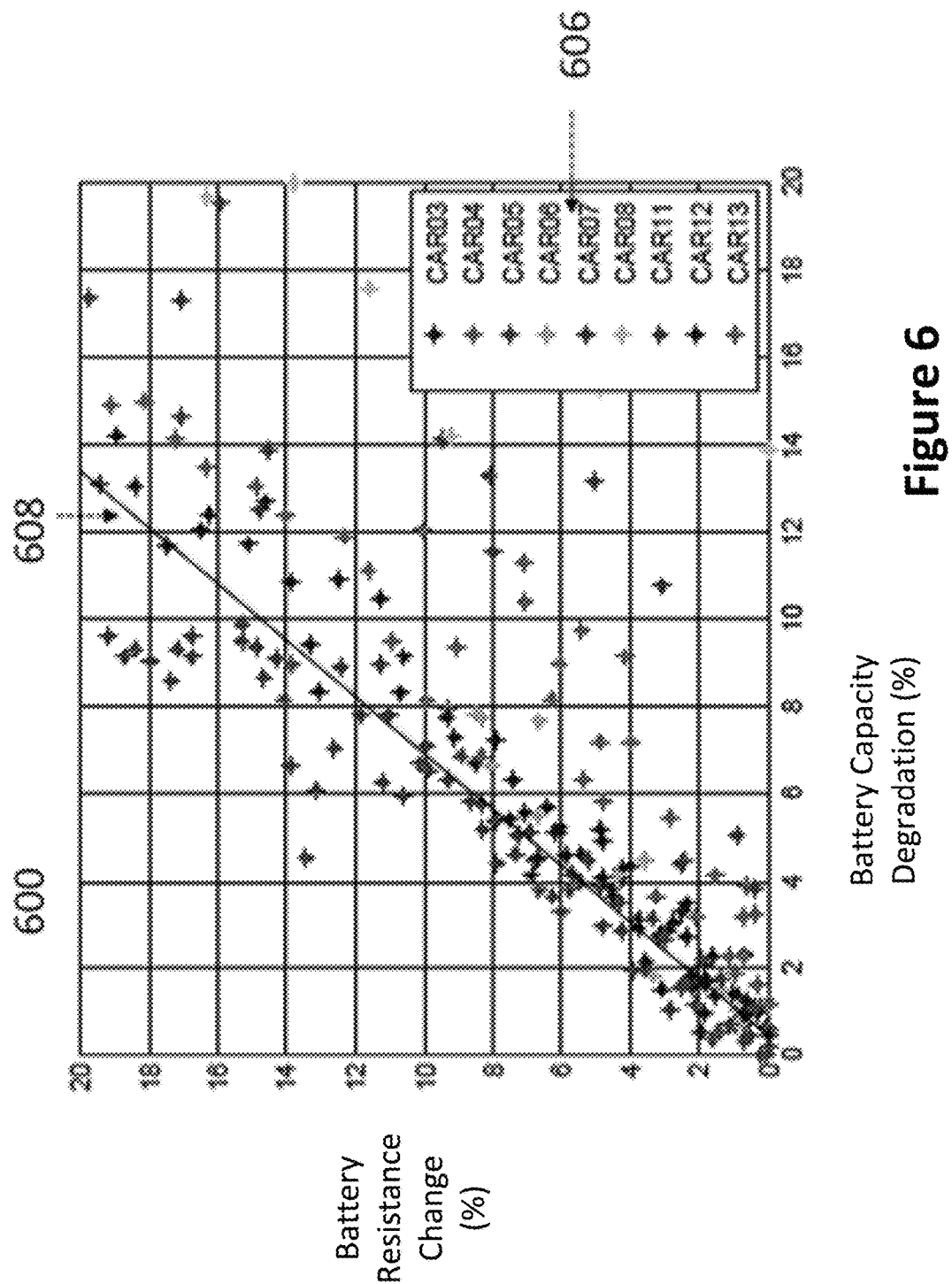
FIG. 6 is a graph showing the relationship between battery resistance change as a percent, versus capacity degradation as a percent, in accordance with various embodiments.

FIG. 6 is a graph 600 showing the relationship between battery resistance change as a percent, versus capacity degradation as a percent. As batteries are used and recharged, they develop over time a resistance to being recharged (e.g., they will hold less charge). If the discharge and recharge profiles are known, it is possible to predict battery life based upon the growth rate of resistance to recharging. This growth rate may be influenced by the driver's behavior. The prediction algorithm involves the battery discharge rate, the electric engine torque, the vehicle speed, and the battery temperature. The data point for the solar car's current state may be compared with an optimal point for minimizing battery resistance growth. In 602, is shown the percent of battery capacity degradation. In 604, is shown the internal resistance growth as a percent. The graph 600 illustrates data for different batteries, as indicated by legend 606. The trend line 608 is shown.

Figure 7:
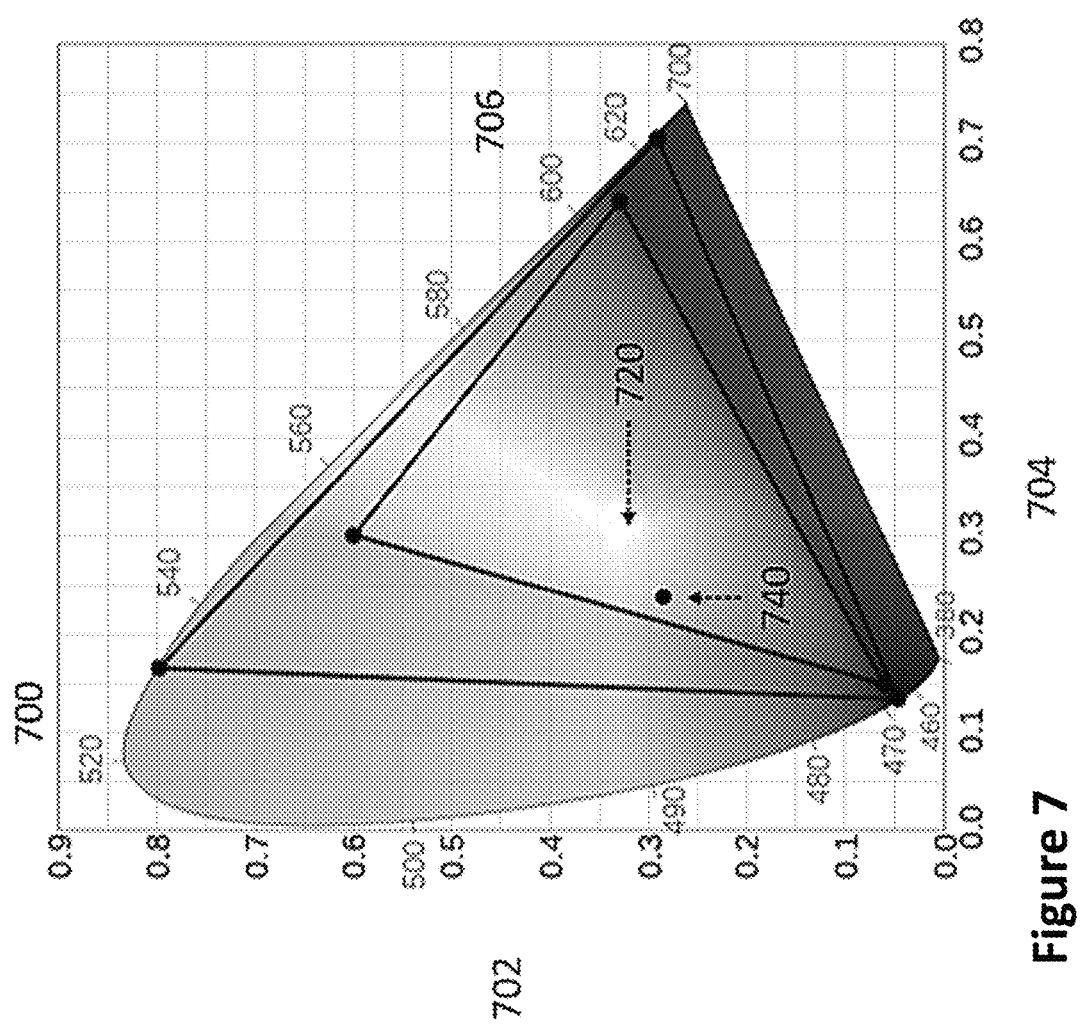
FIG. 7 is graphic illustrating the use of metadata to inform the driver as to actions that may be taken to operate the solar car in an optimal manner.

FIG. 7 is graphic 700 illustrating the use of metadata to inform the driver as to actions that may be taken to operate the solar car in an optimal manner. The graphic 700 may depict the false-color metadata of battery discharge rate, engine torque, and vehicle speed. At 702, is shown the battery discharge rate, on the y-axis. At 704, is shown the engine torque, on the x-axis. The vehicle speed is shown at 706, on the z-axis. At 720, is shown an area of optimal vehicle performance for the current speed. At 740, is shown the vehicle's current performance. If engine torque is increased (acceleration), 740 will move toward optimality or 720. The false-color of the graphic 700 is dynamic, changing all the time, and may be refreshed several times per second depending upon design.

Figure 8:
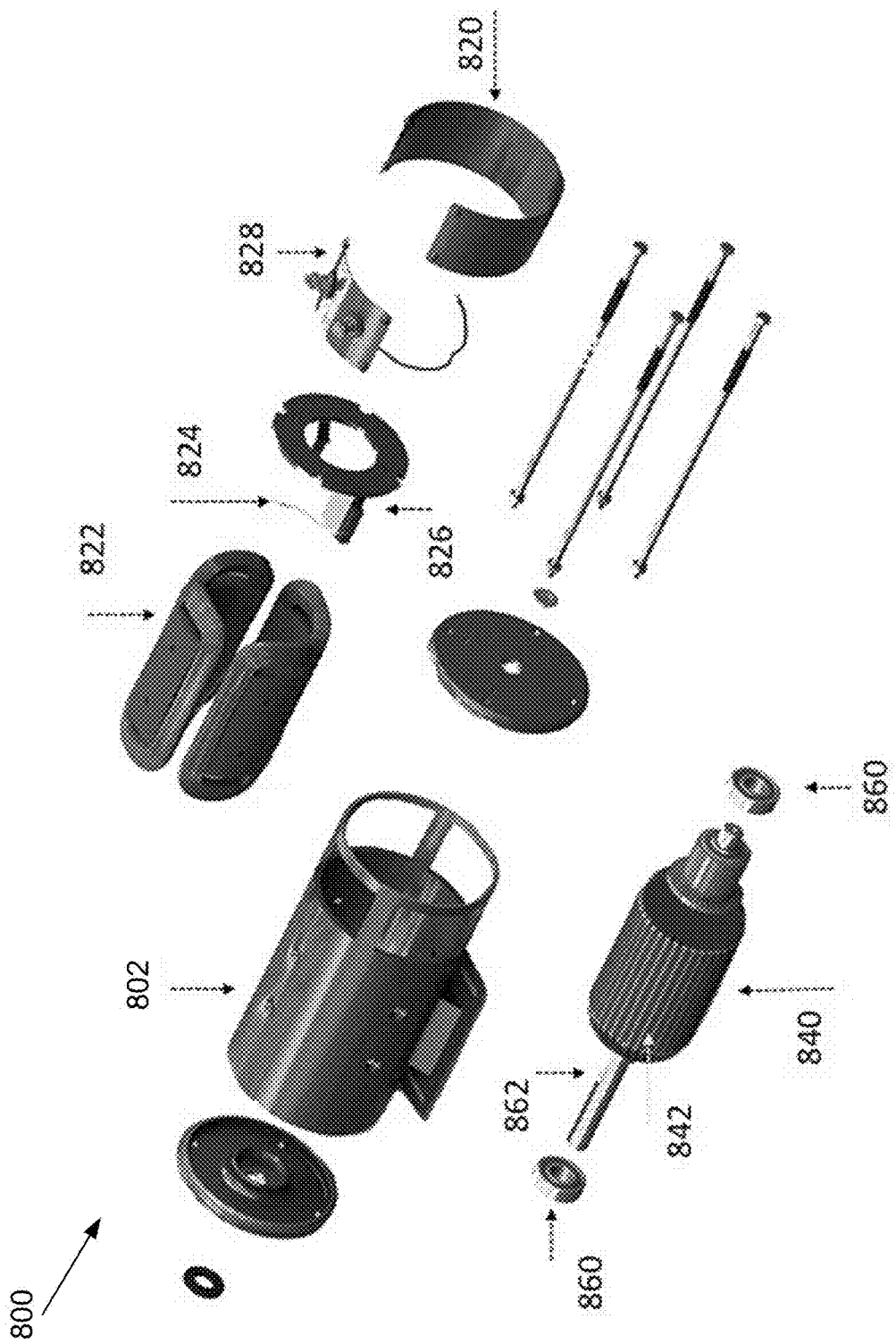
FIG. 8 illustrates an exploded view of an electric engine, in accordance with various embodiments.

FIG. 8 illustrates an exploded view of an electric engine 800, in accordance with various embodiments. The electric engine 800 may be used in the solar car as described herein, and/or in another type of electric car (e.g., non-solar car).

The engine 800 may include an exterior housing 802. In some embodiments, the housing 802 may be formed of aluminum (e.g., aircraft-grade aluminum). The engine 800 may further include an outer ring 820 with fixed electromagnets 822. The outer ring 822 may be disposed in the housing 802 when the motor 800 is assembled. In some embodiments, the fixed electromagnets 822 may be annealed amorphous nickel. The fixed electromagnets 822 may be arranged in a ring within the outer ring 820. For example, in some embodiments, the fixed electromagnets 822 may be arranged in a Halbach configuration. A Halbach configuration is a geometrical arrangement of permanent magnets that add to the magnetic field on one side of the arrangement while cancelling the field to near zero on the opposite side.

The Halbach effect permits cancellation, reinforcement, and rotation of magnetic fields based upon the geometry of the magnets relative to each other, enabling an efficient electric motor to be formed.

The outer ring 820 may further include conductive wires 824 coupled with the electromagnets 822. In some embodiments, the conductive wires 824 may be a superconducting wire, such as stanene (an atomic layer of tin on graphene) or another suitable superconductor as described herein. Insulated stanene is superconducting to over 100° C. Annealed amorphous nickel has the highest coercivity of any electromagnet.

The motor 800 may further include an inner ring 838 with permanent magnets 842 arranged within a housing 840. The inner ring 838 may be disposed within the opening in the outer ring 820. In some embodiments, the magnets 842 may be neodymium iron boron magnets. In terms of materials, neodymium iron boron magnets are the strongest permanent magnets, until 140° C. Then samarium cobalt becomes the strongest. As the operating temperature of the solar car is below 100° C., neodymium iron boron is used.

The motor 800 may further include a bearing 860. The bearing 860 may be disposed in the hole 862, along with the shaft of the electric motor (not shown). In some embodiments, the bearing 860, may be a bearing with zero sliding friction, giving it a very low friction compared to traditional bearings. Alternatively, a magnetic bearing (not shown) may be used, especially if surplus power is available. A magnetic bearing has no mechanical wear due to magnetic levitation, and is frictionless if operated in a vacuum.

In the motor 800, an inner ring 838 (also referred to as the armature) with permanent magnets 842 may rotate. Accordingly, the inner ring/armature 838 may be referred to as the rotor. The outer ring 820 with the electromagnets 822 is stationary, so it is called the stator.

The motor 800 may further include a DC power input 828 and electronics 826 coupled between the DC power input 828 and the electromagnets 822. When electricity (e.g., DC power) is passed to the electromagnets 822 (e.g., from the DC power input 828 as controlled by the electronics 826), it creates a magnetic field that attracts and repels the permanent magnets 842 in the armature 838. This causes the armature 838 to spin through 180 degrees, and thereby generate torque on the motor shaft. To keep it spinning, the poles of the electromagnets 822 are changed. Both the electromagnets 822 and the permanent magnets 842 are placed in Halbach configurations. If placed correctly, the magnetic flux density of the magnetic field increases for both magnets and the net result is potentially double the magnetic field strength of the permanent magnets 842 and the electromagnets 822.

Accordingly, as discussed above, one example embodiment for the engine described, in an operating environment below 100° C. is—neodymium iron boron magnets, annealed amorphous nickel electromagnets in a Halbach configuration, with superconducting wire for the electromagnets 822, using zero sliding friction bearings, and associated control circuitry. If surplus power is available, then magnetic bearings may be utilized instead of zero sliding friction bearings. Either of these designs may be considered an ideal electric engine.

In some embodiments, the engine 800 may be capable of 365 Hp at 99% efficiency. If a solar car is designed to race in Formula E, it may have as many as 4 of these engines, each directly attached to a wheel. This results in a 1460 Hp, solar powered car. This type of design is useful as Formula E permits pit stops when empty batteries may be swapped out for full ones. The photovoltaic nature of the car when racing Formula E means longer distance between pit stops and/or a faster speed between pit stops. The faster time is important to Formula E racing, but some solar challenge races feature furthest distance as the winning criteria.

Figure 9:
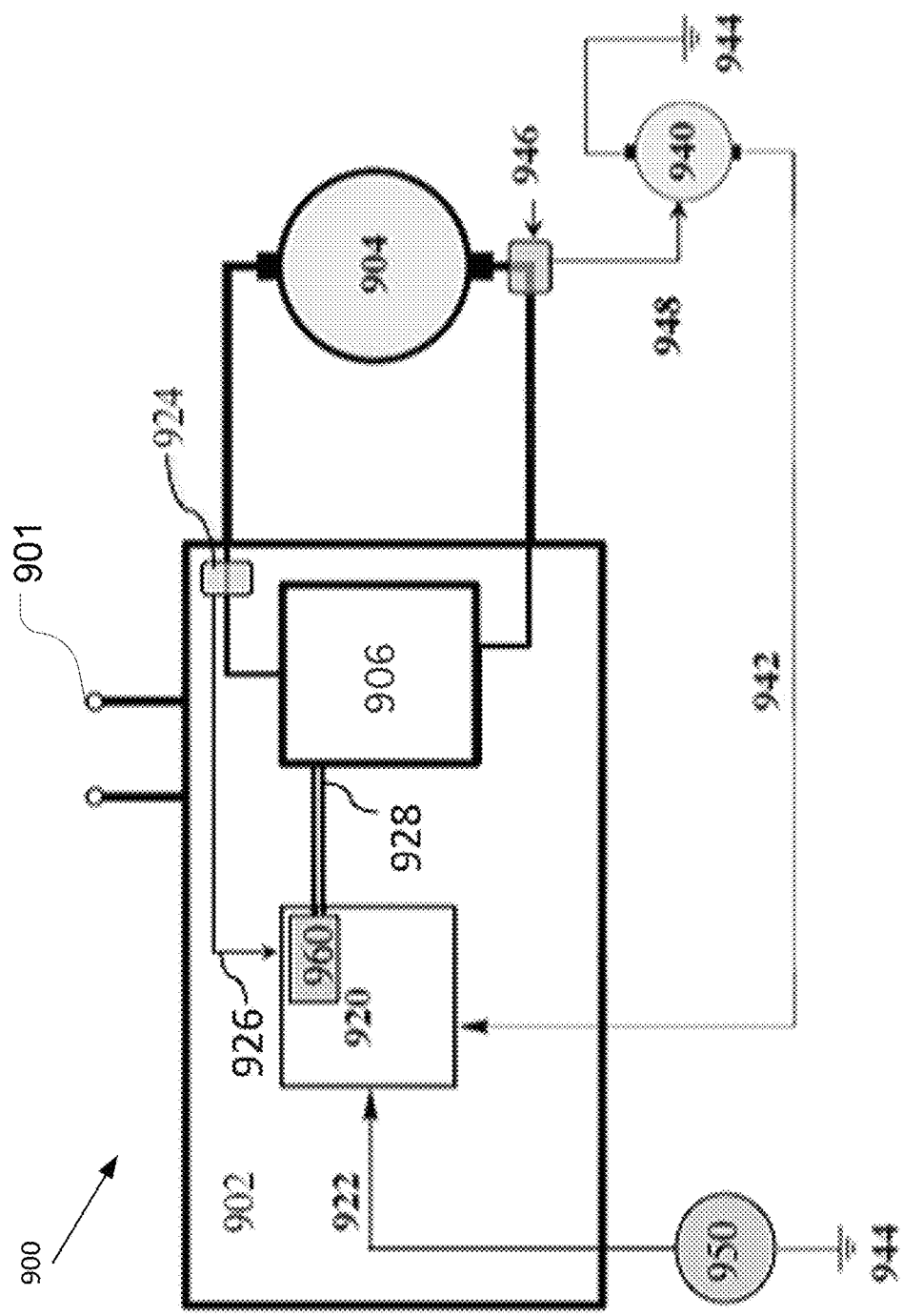
FIG. 9 schematically illustrates a control system that may be used to control an electric motor, in accordance with various embodiments.

Electric motor operations for the solar car require a solid-state adjustable speed drive, enabling the engine to run below one Hp. An example solution for this is shown in FIG. 9. The solar car is expected to have dynamic load conditions. As such, the electric motor may draw current in excess of its design limits. Putting a current feedback loop inside the voltage control loop, enables automatic current limiting. In this manner, for any given set point voltage, if current draw attempts to exceed design limitations for the electric engine, the excess current is held to the maximum value permitted. Current consumption, or torque is limited by the current feedback loop, protecting the engine.

FIG. 9 schematically illustrates a control system 900 that may be used to control the electric motor (e.g., motor 800) in accordance with various embodiments. The control system 900 may include a software controlled voltage loop circuit, with a software settable current limiting control loop within.

The control system 900 may include control circuitry 902 coupled to an electric motor 904. In some embodiments, the control circuitry 902 may be coupled to the electric motor 904 via electronics 906. The electronics 906 may include safety elements (e.g., fuses, high energy diodes, switches, etc.) and/or a wiring block for DC power between the electric motor 904 and sensors. The control circuitry 902 may be coupled to a DC power supply 901 (e.g., which may correspond to the battery of the solar car). The control circuitry 902 may include a motor voltage and current control circuitry 920 (also referred to as "circuitry 920"). The circuitry 920 may receive a vehicle speed reference (e.g., from speedometer 950) to indicate a speed of the solar car. The circuitry 920 may further receive torque feedback from a tachometer 940 that is coupled to the motor 904. A rotational transducer 946 is coupled between the motor 904 and the tachometer 940, and provides information on the rotation of the motor 904 to the tachometer 940 to enable the tachometer 940 to sense engine torque.

A current sensor 924 may measure the current drawn by the motor 904, and may provide the current measurement to the circuitry 920 (e.g., at 926). The circuitry 920 may be coupled to the motor 904 by power cables 928.

For a given voltage, the current draw to deliver torque may exceed the maximum current limitation ($I_{max}$) of the motor 904. The circuitry 920 may include a current limiter 960 to limit current that is provided to the motor 904 to below $I_{max}$. The current draw is sensed by the current sensor 924, limited by current limiter 960, and delivered to the electric motor 904 via the power cables 928. Driving the solar car up a steep hill, at high velocity and attempting to maintain that velocity, might create an overcurrent situation. Without the current limiter 960 and associated sensors to govern motor current, the armature for the motor electromagnets may overheat, causing damage and eventual failure.

Voltage to the electric motor 904 may increase and in turn this may speed the solar car up, depending upon terrain. If the terrain trends down (gravitationally aided), the electric motor 904 may draw less current as the torque increases. If the terrain trends up (gravitationally hindered), the electric motor 904 may draw more current to maintain the torque. It is likely situations develop where the current drawn exceeds the design limitations of the electric motor. Accordingly, current limiting may be instituted to protect the motor 904.

A number of methods may be used to implement DC current limiting. For example, in some embodiments, the current limiter 960 may include a one-transistor circuit with a pre-calculated $I_{max}$ performing current limiting inside the voltage and current control circuitry 920. $I_{max}$ is dynamic in that it is temperature dependent, and software may be used to determine the value of $I_{max}$. It is possible to have other applications that use software to select $I_{max}$, rather than over current protection; viz. solar racing where the optimal speed of the solar racing car, for power to the electric motor, discharge rate of the battery, and charge rate of the battery from the photovoltaics are computed in real time.

In this case, software controlled DC current limiting uses a transistor to limit or clip the current to a software defined $I_{max}$. The timeframe of the clip to $I_{max}$ may be less than 0.000001 seconds, being handled in interrupt service that also turns on a programmable $I_{max}$ with a preloaded value. If the value of $I_{max}$ is to change, it does so using an inter-integrated circuits (I$_2$C) type interface. The time required is typically microseconds.

Figure 10:
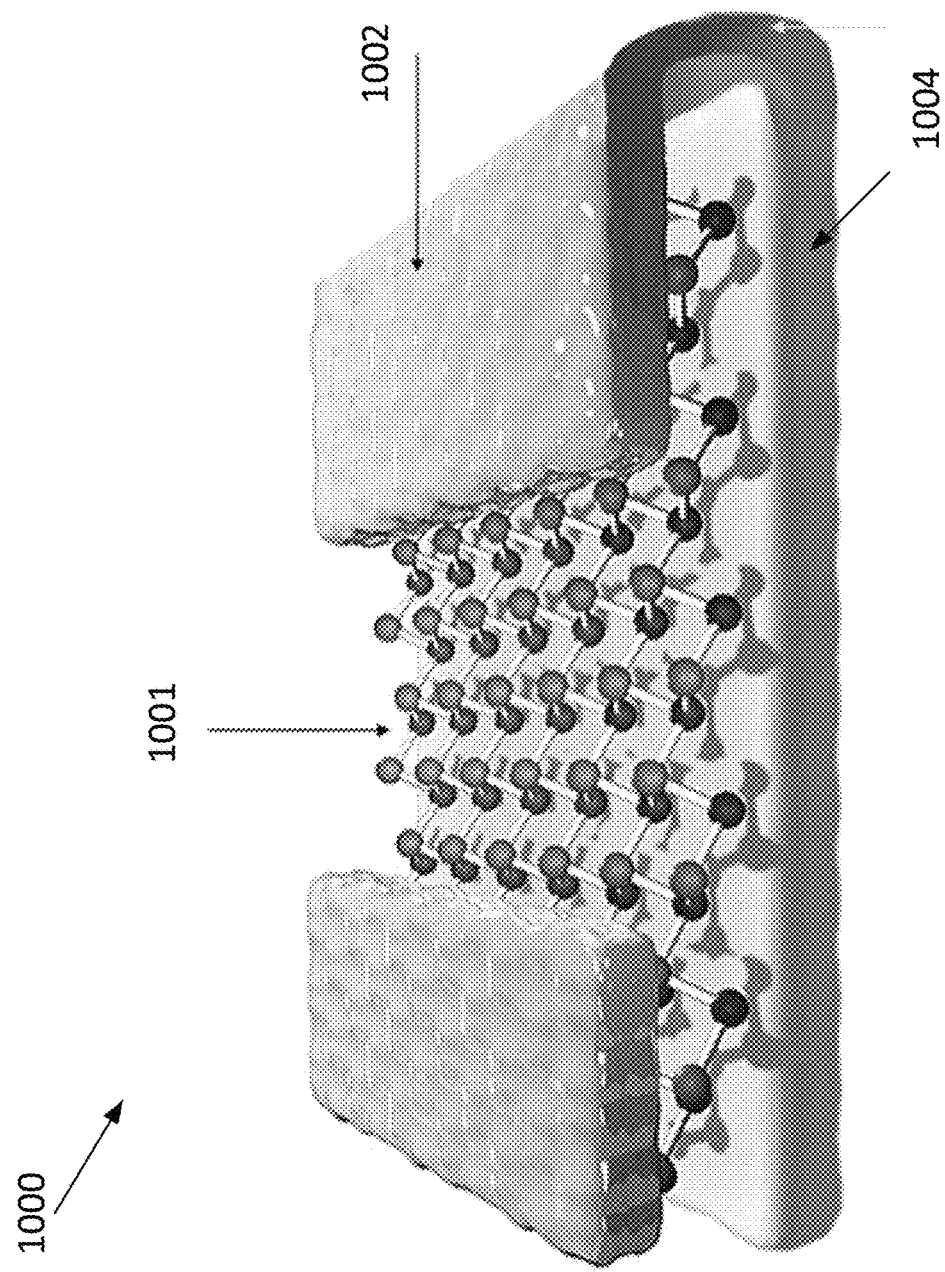
FIG. 10 illustrates a partially deconstructed view of an insulated superconductor, in accordance with various embodiments.

FIG. 10 illustrates a partially deconstructed view of an insulated superconductor 1000, in accordance with various embodiments. The insulated superconductor 1000 may be used for the wires 824 of the motor 800, an anode wire and/or cathode wire (e.g., anode wire 222 and/or cathode wire 224) coupled to a solar cell, and/or another conductive component of the solar car described herein. Insulated superconductor 1000 includes a superconductor 1001, such as a graphene-based superconductor 1001. For example, the superconductor 1001 may include a monolayer of graphene coupled to a monolayer of tin (Sn), or stanene.

An insulator may be formed on the top, bottom, and side surfaces of the superconductor 1001, completely surrounding and protecting it. For example, a first layer 1002 of insulating material may be formed on the top surface of the superconductor 1001, and a second layer 1004 of insulating material may be formed on the bottom surface of the superconductor 1001. The first layer 1002 and second layer 1004 may connect at the sides of the superconductor 1001 to completely surround the superconductor 1001 (except for the ends that provide the conductive connection). The first layer 1002 and/or second layer 1004 may include one or more molecular layers of a suitable insulating material, such as aluminum oxide, $Al_2O_3$. For example, in some embodiments, the first layer 1002 and/or second layer 1004 may include two or three layers of $Al_2O_3$, making it a bit thicker than the stanene of the superconductor 1001. In some embodiments, the insulated superconductor 1000 may be coated with another material, such as silicone. $Al_2O_3$ does bend some, and if coated with two or three monolayers of silicone, makes wire that is only a few nanometers thick.

In other embodiments, the first layer 1002 and second layer 1004 may be different materials. For example, the first layer 1002 (adjacent the tin) may be methyl ($CH_4$), and the second layer 1004 (adjacent the graphene) may be $Al_2O_3$. The resulting material structure may be coated in silicone or another material.

In various embodiments, a conductive wire may include many strands of the insulated superconductor 1000, for example 10,000 strands, in a protective sheath. The conductive wire may be used for the wires 824 of the electric motor 800, the anode and/or cathode wires, and/or another conductive wire for the solar car described herein.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

The invention claimed is:

1. A solar car comprising:
   a structural frame;
   an electric motor;
   a battery to power the electric motor; and
   a solar car panel coupled to the structural frame, the solar car panel forming an exterior surface of the solar car, and the solar car panel including:
   a solar cell to charge the battery, wherein the solar cell has a three-dimensional shape that corresponds to the exterior surface of the solar car;
   a first encapsulant layer that at least partially encapsulates the solar cell, wherein the first encapsulant layer includes polychlorotrifluoroethylene (PCTFE);
   a second encapsulant layer on the first encapsulant layer, wherein the second encapsulant layer at least partially encapsulates the solar cell, and wherein the second encapsulant layer includes silicone; and
   a third encapsulant layer on the second encapsulant layer, wherein the third encapsulant layer at least partially encapsulates the solar cell, and wherein the third encapsulant layer includes glass.

2. The solar car of claim 1, wherein the solar car panel is a hood, a roof, a trunk, or a door of the solar car, and wherein the three-dimensional shape of the solar panel corresponds to a shape of the respective hood, roof, trunk, or door.

3. The solar car of claim 1, wherein the third encapsulant layer includes a first portion of low iron glass and a second portion of structural glass coupled together by a microelectromechanical systems (MEMS) bond, wherein the first portion faces the exterior surface and wherein the second portion faces an interior region of the solar car.

4. The solar car of claim 1, wherein the third encapsulant layer partially encapsulates the solar cell to leave an interior side of the second encapsulant layer exposed, and wherein the solar car panel further includes:
   a support structure coupled to the interior side of the second encapsulant layer by an adhesive and bonded to the third encapsulant layer by a microelectromechanical systems (MEMS) bond.

5. The solar car of claim 1, further comprising a window coupled to the solar car panel, wherein the window includes a solar cell having a transparent thin-film photovoltaic material.

6. The solar car of claim 5, wherein the solar car panel corresponds to a door of the solar car, and wherein the window is configured to move relative to the door.

7. The solar car of claim 5, wherein the window corresponds to a windshield of the solar car, and wherein the window further includes a tinted region that includes a tandem solar cell formed by the transparent thin-film photovoltaic material and a perovskite.

8. The solar car of claim 1, further comprising a direct current (DC) power converter coupled to the solar cell to set the solar cell at a maximum power point and derive a DC output power signal from the solar cell.

9. The solar car of claim 8, further comprising a power combiner to:
   receive the DC output power signal;
   combine the DC output power signal with another DC output power signal from one or more other solar car panels of the solar car; and
   pass the combined DC output power signal to the battery to charge the battery.

10. The solar car of claim 1, wherein the second encapsulant layer is thicker on an interior side of the solar cell that faces an interior of the solar car than on an exterior side of the solar cell that faces the exterior surface of the solar car.

11. The solar car of claim 1, further comprising:
    an anode wire coupled to an anode of the solar cell; and
    a cathode wire coupled to a cathode of the solar cell;
    wherein the anode wire and cathode wire extend through an opening in the third encapsulant layer, and wherein the opening is filled with a fill material that is different from respective materials of the second and third encapsulant layers.

12. The solar car of claim 11, wherein the fill material is sodium silicate.

13. The solar car of claim 1, wherein the first, second, and third encapsulant layers fully encapsulate the solar cell.

14. A solar car comprising:
    a structural frame;
    an electric motor;
    a battery to power the electric motor; and
    a solar car panel coupled to the structural frame, the solar car panel forming an exterior surface of the solar car, and the solar car panel including:
    a solar cell to charge the battery, wherein the solar cell has a three-dimensional shape that corresponds to the exterior surface of the solar car;
    a first encapsulant layer that at least partially encapsulates the solar cell;
    a second encapsulant layer on the first encapsulant layer, wherein the second encapsulant layer at least partially encapsulates the solar cell;
    a third encapsulant layer on the second encapsulant layer, wherein the third encapsulant layer at least partially encapsulates the solar cell;
    an anode wire coupled to an anode of the solar cell; and
    a cathode wire coupled to a cathode of the solar cell;
    wherein the anode wire and cathode wire extend through an opening in the third encapsulant layer, and wherein the opening is filled with a fill material that is different from respective materials of the second and third encapsulant layers.

15. The solar car of claim 14, wherein the fill material is sodium silicate.

16. The solar car of claim 14, wherein the solar car panel is a hood, roof, a trunk, or a door of the solar car, and wherein the three-dimensional shape of the solar panel corresponds to a shape of the respective hood, roof, trunk, or door.

17. The solar car of claim 14, wherein the third encapsulant layer includes a first portion of low iron glass and a second portion of structural glass coupled together by a microelectromechanical systems (MEMS) bond, wherein the first portion faces the exterior surface and wherein the second portion faces an interior region of the solar car.

18. The solar car of claim 14, wherein the third encapsulant layer partially encapsulates the solar cell to leave an interior side of the second encapsulant layer exposed, and wherein the solar car panel further includes:
    a support structure coupled to the interior side of the second encapsulant layer by an adhesive and bonded to the third encapsulant layer by a microelectromechanical systems (MEMS) bond.

19. The solar car of claim 14, further comprising a window coupled to the solar car panel, wherein the window includes a solar cell having a transparent thin-film photovoltaic material.

20. The solar car of claim 19, wherein the solar car panel corresponds to a door of the solar car, and wherein the window is configured to move relative to the door.

21. The solar car of claim 19, wherein the window corresponds to a windshield of the solar car, and wherein the window further includes a tinted region that includes a tandem solar cell formed by the transparent thin-film photovoltaic material and a perovskite.

22. The solar car of claim 13, further comprising a direct current (DC) power converter coupled to the solar cell to set the solar cell at a maximum power point and derive a DC output power signal from the solar cell.

23. The solar car of claim 22, further comprising a power combiner to:
receive the DC output power signal;
combine the DC output power signal with another DC output power signal from one or more other solar car panels of the solar car; and
pass the combined DC output power signal to the battery to charge the battery.

24. The solar car of claim 14, wherein the second encapsulant layer is thicker on an interior side of the solar cell that faces an interior of the solar car than on an exterior side of the solar cell that faces the exterior surface of the solar car.

25. A solar car comprising:
a structural frame;
an electric motor, wherein the electric motor includes:
an outer ring having electromagnets;
an inner ring having permanent magnets;
a conductive wire coupled between the battery and the electromagnets to activate the electromagnets and thereby drive the motor, wherein the conductive wire includes a plurality of conductive strands, and wherein individual strands of the plurality of conductive strands include:
a first layer and a second layer coupled to one another, wherein the first layer and second layer are atomic or molecular monolayers and at least one of the first layer or second layer has a hexagonal atomic or molecular structure; and
an first insulating layer on the first layer, the first insulating layer is a first insulating material;
a second insulating layer on the second layer, wherein the second insulating layer is the first insulating material or a second insulating material; and
a coating material surrounding the first layer, the second layer, the first insulating layer, and the second insulating layer;
a battery to power the electric motor; and
a solar car panel coupled to the structural frame, the solar car panel forming an exterior surface of the solar car, and the solar car panel including a solar cell to charge the battery.

26. The solar car of claim 25, wherein:
the first layer is graphene;
the second layer is tin;
the first insulating material is aluminum oxide ($Al_2O_3$); and
the second insulating material is aluminum oxide or methyl ($CH_4$).

27. The solar car of claim 25, wherein the electromagnets include amorphous nickel and the permanent magnets include neodymium iron boron.

28. The solar car of claim 25, further comprising control circuitry coupled to the electromagnets via the conductive wire, the control circuitry including:
a first control loop to control the electric motor based on at least one of velocity and torque feedback; and
a second control loop to sense a current draw of the electric motor and limit the current draw to below a threshold.

29. The solar car of claim 25, wherein the solar cell has a three-dimensional shape that corresponds to the exterior surface of the solar car, and wherein the solar car panel further includes:
a first encapsulant layer that at least partially encapsulates the solar cell;
a second encapsulant layer on the first encapsulant layer, wherein the second encapsulant layer at least partially encapsulates the solar cell; and
a third encapsulant layer on the second encapsulant layer, wherein the third encapsulant layer at least partially encapsulates the solar cell.

* * * * *